(12) United States Patent
Iwakaji et al.

(10) Patent No.: US 12,027,611 B2
(45) Date of Patent: Jul. 2, 2024

(54) SEMICONDUCTOR DEVICE AND METHOD FOR DRIVING SAME

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Tomoko Matsudai, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 323 days.

(21) Appl. No.: 17/470,692

(22) Filed: Sep. 9, 2021

(65) Prior Publication Data
US 2022/0293778 A1 Sep. 15, 2022

(30) Foreign Application Priority Data
Mar. 10, 2021 (JP) .................. 2021-038456

(51) Int. Cl.
*H01L 29/739* (2006.01)
*H01L 29/86* (2006.01)
*H01L 29/861* (2006.01)

(52) U.S. Cl.
CPC ........ *H01L 29/7397* (2013.01); *H01L 29/861* (2013.01)

(58) Field of Classification Search
CPC .......................... H01L 29/7397; H01L 29/861
USPC ...................................................... 257/295
See application file for complete search history.

(56) References Cited

U.S. PATENT DOCUMENTS

| | | | |
|---|---|---|---|
| 9,153,576 B2 | 10/2015 | Hosokawa et al. | |
| 9,589,952 B2 | 3/2017 | Senoo | |
| 9,685,512 B2 | 6/2017 | Okawara et al. | |
| 2019/0051648 A1 | 2/2019 | Kakimoto et al. | |
| 2019/0287963 A1 | 9/2019 | Kondoh et al. | |
| 2020/0105745 A1* | 4/2020 | Obata | H01L 29/868 |
| 2020/0161460 A1* | 5/2020 | Harada | H01L 27/0635 |
| 2021/0384189 A1* | 12/2021 | Honda | H01L 29/456 |

(Continued)

FOREIGN PATENT DOCUMENTS

| | | |
|---|---|---|
| JP | 2015-141935 A | 8/2015 |
| JP | 2016-164952 A | 9/2016 |
| JP | 2016-225345 A | 12/2016 |

(Continued)

*Primary Examiner* — Igwe U Anya
(74) *Attorney, Agent, or Firm* — Maier & Maier, PLLC

(57) ABSTRACT

A semiconductor device includes: a first electrode; a first semiconductor layer located on the first electrode in a diode region; a second semiconductor layer located on the first electrode in an IGBT region; a third semiconductor layer located in the diode region, the boundary region, and the IGBT region and positioned on the first semiconductor layer and the second semiconductor layer; a fourth semiconductor layer located on the third semiconductor layer in the boundary region and the IGBT region; a fifth semiconductor layer located on the third semiconductor layer and the fourth semiconductor layer; a second electrode located in the diode region; a third electrode located in the IGBT region; and a fourth electrode extending from an upper surface of the fifth semiconductor layer toward the third semiconductor layer in the boundary region and electrically insulated from the third electrode.

11 Claims, 14 Drawing Sheets

(56) References Cited

U.S. PATENT DOCUMENTS

2022/0122966 A1* 4/2022 Nishi ................ H01L 29/0696
2022/0123132 A1* 4/2022 Nishi ................... H01L 29/407

FOREIGN PATENT DOCUMENTS

| JP | 2019-161112 A | 9/2019 |
| JP | 6652173 B2 | 2/2020 |
| JP | 6658021 B2 | 3/2020 |
| WO | 2019/116696 A1 | 6/2019 |

* cited by examiner

SEMICONDUCTOR DEVICE AND METHOD FOR DRIVING SAME

CROSS-REFERENCE TO RELATED APPLICATIONS

This application is based upon and claims the benefit of priority from the prior Japanese Patent Application No. 2021-038456, filed on Mar. 10, 2021; the entire contents of which are incorporated herein by reference.

FIELD

Embodiments described herein relate generally to a semiconductor device and a method for driving same.

BACKGROUND

A diode region and an IGBT (Insulated Gate Bipolar Transistor) region are set in a known RC-IGBT (Reverse Conducting-IGBT). In an RC-IGBT, a return current from the emitter side toward the collector side of the IGBT region can be caused to flow in the diode region.

In the state in which the return current flows in the diode region of the RC-IGBT, that is, in the state in which the diode region is on, the on-voltage of the diode region decreases as the injection amount of carriers such as electrons, holes, and the like into the base layer increases. The steady loss of the diode region decreases as the on-voltage of the diode region decreases. On the other hand, the recovery loss when the diode region recovers increases as the carriers in the base layer increase. Thus, the steady loss and the recovery loss of the diode region have a trade-off relationship.

DETAILED DESCRIPTION

Figure 1:
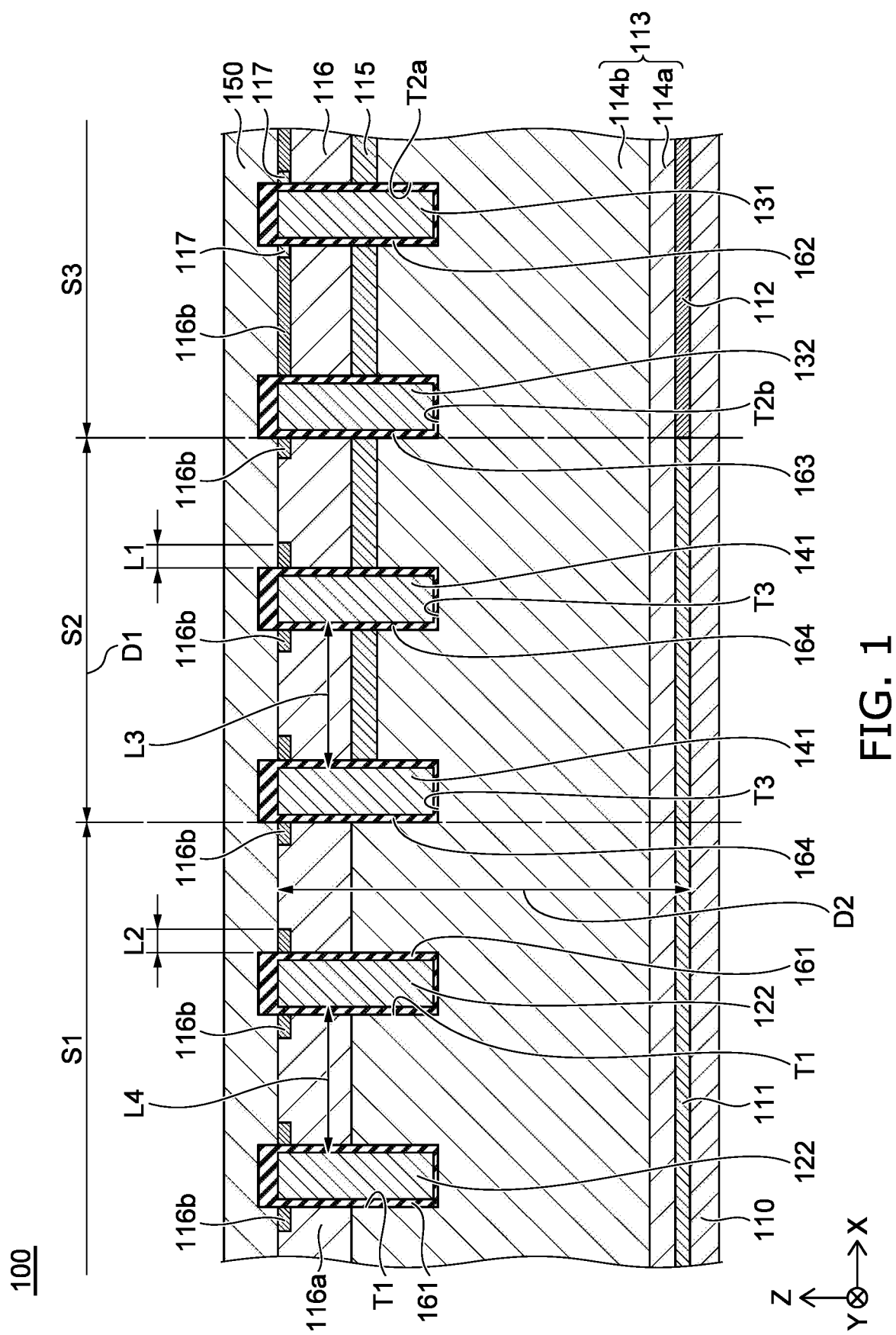
FIG. 1 is a cross-sectional view showing a semiconductor device according to a first embodiment.

A semiconductor device according to an embodiment includes: a diode region, an IGBT region, and a boundary region set in the semiconductor device, wherein the boundary region is positioned between the diode region and the IGBT region; a first electrode located in the diode region, the boundary region, and the IGBT region; a first semiconductor layer that is located on the first electrode in the diode region and is of a first conductivity type; a second semiconductor layer that is located on the first electrode in the IGBT region and is of a second conductivity type; a third semiconductor layer that is located in the diode region, the boundary region, and the IGBT region, is positioned on the first semiconductor layer in the diode region, is positioned on the second semiconductor layer in the IGBT region, is of the first conductivity type, and has a lower impurity concentration than the first semiconductor layer; a fourth semiconductor layer that is located on the third semiconductor layer in the boundary region and the IGBT region, is of the first conductivity type, and has a higher impurity concentration than an upper layer portion of the third semiconductor layer; a fifth semiconductor layer that is located on the third semiconductor layer in the diode region, is located on the fourth semiconductor layer in the boundary region and the IGBT region, and is of the second conductivity type; a sixth semiconductor layer that is located at an upper layer portion of the fifth semiconductor layer in the IGBT region and is of the first conductivity type; a second electrode that extends from an upper surface of the fifth semiconductor layer toward the third semiconductor layer in the diode region and is next to the fifth semiconductor layer and the third semiconductor layer in a first direction that is from the diode region toward the IGBT region; a third electrode that extends from an upper surface of the sixth semiconductor layer toward the third semiconductor layer in the IGBT region and is next to the sixth semiconductor layer, the fifth semiconductor layer, the fourth semiconductor layer, and the third semiconductor layer in the first direction; a fourth electrode that extends from the upper surface of the fifth semiconductor layer toward the third semiconductor layer in the boundary region, is next to the fifth semiconductor layer, the fourth semiconductor layer, and the third semiconductor layer in the first direction, and is electrically insulated from the third electrode; a fifth electrode located on the fifth semiconductor layer; a first insulating film located between the second electrode and the fifth semiconductor layer and between the second electrode and the third semiconductor layer; a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer.

A semiconductor device according to an embodiment includes: a diode region, an IGBT region, and a boundary region set in the semiconductor device, wherein the boundary region is positioned between the diode region and the IGBT region; a first electrode located in the diode region, the boundary region, and the IGBT region; a first semiconductor layer that is located on the first electrode in the diode region and is of a first conductivity type; a second semiconductor layer that is located on the first electrode in the IGBT region and is of a second conductivity type; a third semiconductor layer that is located in the diode region, the boundary region, and the IGBT region, is positioned on the first semiconductor layer in the diode region, is positioned on the second semiconductor layer in the IGBT region, is of the first conductivity type, and has a lower impurity concentration than the first semiconductor layer; a fourth semiconductor layer that is located on the third semiconductor layer in the diode region, the boundary region, and the IGBT region, is of the first conductivity type, and has a higher impurity concentration than an upper layer portion of the third semiconductor layer; a fifth semiconductor layer that is located on the fourth semiconductor layer in the diode region, the boundary region, and the IGBT region and is of the second conductivity type; a sixth semiconductor layer that is located at an upper layer portion of the fifth semiconductor layer in the IGBT region and is of the first conductivity type; a second electrode that extends from an upper surface of the fifth semiconductor layer toward the third semiconductor layer in the diode region and is next to the fifth semiconductor layer and the third semiconductor layer in a first direction that is from the diode region toward the IGBT region; a third electrode that extends from an upper surface of the sixth semiconductor layer toward the third semiconductor layer in the IGBT region and is next to the sixth semiconductor layer, the fifth semiconductor layer, the fourth semiconductor layer, and the third semiconductor layer in the first direction; a fourth electrode that extends from the upper surface of the fifth semiconductor layer toward the third semiconductor layer in the boundary region, is next to the fifth semiconductor layer, the fourth semiconductor layer, and the third semiconductor layer in the first direction, and is electrically insulated from the second and third electrodes; a fifth electrode located on the fifth semiconductor layer; a first insulating film located between the second electrode and the fifth semiconductor layer, between the second electrode and the fourth semiconductor layer, and between the second electrode and the third semiconductor layer; a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer.

A semiconductor device according to an embodiment includes: a diode region, an IGBT region, and a boundary region set in the semiconductor device, wherein the boundary region is positioned between the diode region and the IGBT region; a first electrode located in the diode region, the boundary region, and the IGBT region; a first semiconductor layer that is located on the first electrode in the diode region and is of a first conductivity type; a second semiconductor layer that is located on the first electrode in the IGBT region and is of a second conductivity type; a third semiconductor layer that is located in the diode region, the boundary region, and the IGBT region, is positioned on the first semiconductor layer in the diode region, is positioned on the second semiconductor layer in the IGBT region, is of the first conductivity type, and has a lower impurity concentration than the first semiconductor layer; a fourth semiconductor layer that is located on the third semiconductor layer in the IGBT region, is of the first conductivity type, and has a higher impurity concentration than an upper layer portion of the third semiconductor layer; a fifth semiconductor layer that is located on the third semiconductor layer in the diode region and the boundary region, is located on the fourth semiconductor layer in the IGBT region, and is of the second conductivity type; a sixth semiconductor layer that is located at an upper layer portion of the fifth semiconductor layer in the IGBT region and is of the first conductivity type; a seventh semiconductor layer that is located in the fifth semiconductor layer in the diode region, is of the first conductivity type, and includes a side surface covered with the fifth semiconductor layer; a second electrode that extends from an upper surface of the fifth semiconductor layer toward the third semiconductor layer in the diode region and is next to the fifth semiconductor layer and the third semiconductor layer in a first direction that is from the diode region toward the IGBT region; a third electrode that extends from an upper surface of the sixth semiconductor layer toward the third semiconductor layer in the IGBT region and is next to the sixth semiconductor layer, the fifth semiconductor layer, the fourth semiconductor layer, and the third semiconductor layer in the first direction; a fourth electrode that extends from the upper surface of the fifth semiconductor layer toward the third semiconductor layer in the boundary region, is next to the fifth semiconductor layer and the third semiconductor layer in the first direction, and is electrically insulated from the third electrode; a fifth electrode located on the fifth semiconductor layer; a first insulating film located between the second electrode and the fifth semiconductor layer and between the second electrode and the third semiconductor layer; a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, and between the fourth electrode and the third semiconductor layer.

A semiconductor device according to an embodiment includes: a diode region, an IGBT region, and a boundary region set in the semiconductor device, wherein the boundary region is positioned between the diode region and the IGBT region; a first electrode located in the diode region, the boundary region, and the IGBT region; a first semiconductor layer that is located on the first electrode in the diode region and is of a first conductivity type; a second semiconductor layer that is located on the first electrode in the IGBT region and is of a second conductivity type; a third semiconductor layer that is located in the diode region, the boundary region, and the IGBT region, is positioned on the first semiconductor layer in the diode region, is positioned on the second semiconductor layer in the IGBT region, is of the first conductivity type, and has a lower impurity concentration than the first semiconductor layer; a fourth semiconductor layer that is located on the third semiconductor layer in the diode region, the boundary region, and the IGBT region, is of the first conductivity type, and has a higher impurity concentration than an upper layer portion of the third semiconductor layer; a fifth semiconductor layer that is located on the fourth semiconductor layer in the diode region, the boundary region, and the IGBT region and is of the second conductivity type; a sixth semiconductor layer that is located at an upper layer portion of the fifth semiconductor layer in the IGBT region and is of the first conductivity type; a second electrode that extends from an upper surface of the fifth semiconductor layer toward the third semiconductor layer in the diode region and is next to the fifth semiconductor layer, the fourth semiconductor layer, and the third semiconductor layer in a first direction that is from the diode region toward the IGBT region; a third electrode that extends from an upper surface of the sixth semiconductor layer toward the third semiconductor layer in the IGBT region and is next to the sixth semiconductor layer, the fifth semiconductor layer, the fourth semiconductor layer, and the third semiconductor layer in the first direction; multiple fourth electrodes that extend from the upper surface of the fifth semiconductor layer toward the third semiconductor layer in the diode region and the boundary region, are next to the fifth semiconductor layer, the fourth semiconductor layer, and the third semiconductor layer in the first direction, and are insulated from the second and third electrodes, wherein an average number of the multiple fourth electrodes per unit length in the first direction in the boundary region is greater than an average number of the multiple fourth electrodes per unit length in the first direction in the diode region; a fifth electrode located on the fifth semiconductor layer; a first insulating film located between the second electrode and the fifth semiconductor layer, between the second electrode and the fourth semiconductor layer, and between the second electrode and the third semiconductor layer; a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and multiple third insulating films located between the fifth electrode and each of the fourth electrodes, between the fifth semiconductor layer and each of the fourth electrodes, between the fourth semiconductor layer and each of the fourth electrodes, and between the third semiconductor layer and each of the fourth electrodes.

A semiconductor device according to an embodiment includes: a diode region, an IGBT region, and a boundary region set in the semiconductor device, wherein the boundary region is positioned between the diode region and the IGBT region; a first electrode located in the diode region, the boundary region, and the IGBT region; a first semiconductor layer that is located on the first electrode in the diode region and is of a first conductivity type; a second semiconductor layer that is located on the first electrode in the IGBT region and is of a second conductivity type; a third semiconductor layer that is positioned on the first semiconductor layer in the diode region, is positioned on the first electrode in the boundary region, is positioned on the second semiconductor layer in the IGBT region, is of the first conductivity type, and has a lower impurity concentration than the first semiconductor layer; a fourth semiconductor layer that is located on the third semiconductor layer in the diode region, the boundary region, and the IGBT region, is of the first conductivity type, and has a higher impurity concentration than an upper layer portion of the third semiconductor layer; a fifth semiconductor layer that is located on the fourth semiconductor layer in the diode region, the boundary region, and the IGBT region and is of the second conductivity type; a sixth semiconductor layer that is located at an upper layer portion of the fifth semiconductor layer in the IGBT region and is of the first conductivity type; a second electrode that extends from an upper surface of the fifth semiconductor layer toward the third semiconductor layer in the diode region and is next to the fifth semiconductor layer, the fourth semiconductor layer, and the third semiconductor layer in a first direction that is from the diode region toward the IGBT region; a third electrode that extends from an upper surface of the sixth semiconductor layer toward the third semiconductor layer in the IGBT region and is next to the sixth semiconductor layer, the fifth semiconductor layer, the fourth semiconductor layer, and the third semiconductor layer in the first direction; a fourth electrode that extends from the upper surface of the fifth semiconductor layer toward the third semiconductor layer in the boundary region, is next to the fifth semiconductor layer, the fourth semiconductor layer, and the third semiconductor layer in the first direction, and is electrically insulated from the third electrode; a fifth electrode located on the fifth semiconductor layer; a first insulating film located between the second electrode and the fifth semiconductor layer, between the second electrode and the fourth semiconductor layer, and between the second electrode and the third semiconductor layer; a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions. In the specification of the application and the drawings, components similar to those described in regard to a drawing thereinabove are marked with like reference numerals, and a detailed description is omitted as appropriate.

For easier understanding of the following description, the arrangements and configurations of the portions are described using an XYZ orthogonal coordinate system. The X-axis, the Y-axis, and the Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". Although the direction of the arrow in the Z-direction is taken as up and the opposite direction is taken as down for easier understanding of the description, these directions are independent of the direction of gravity.

Hereinbelow, the notations of + and − indicate relative levels of the impurity concentrations of each conductivity type. Specifically, a notation marked with "+" has a relatively higher impurity concentration than a notation marked with "−". A notation that is not marked with "+" or "−" has a relatively lower impurity concentration than a notation marked with "+" and a relatively higher impurity concentration than a notation marked with "−". Here, when both an impurity that forms donors and an impurity that forms acceptors are included in each region, the "impurity concentration" means the net impurity concentration after the impurities cancel.

First Embodiment

First, a first embodiment will be described.

FIG. 1 is a cross-sectional view showing a semiconductor device according to the embodiment.

The semiconductor device 100 according to the embodiment is an RC-IGBT. A diode region S1, an IGBT region S3, and a boundary region S2 that is positioned between the diode region S1 and the IGBT region S3 are set in the semiconductor device 100.

According to the embodiment, the semiconductor device 100 includes a lower electrode 110, an $n^+$-type cathode layer 111, a $p^+$-type collector layer 112, an n-type layer 113, an n-type barrier layer 115, a p-type layer 116, an $n^+$-type emitter layer 117, an internal electrode 122, a gate electrode 131, an internal electrode 132, a gate electrode 141, an upper electrode 150, and multiple insulating films 161, 162, 163, and 164. The components of the semiconductor device 100 will now be elaborated.

The lower electrode 110 is made of a conductive material such as a metal material, etc. The lower electrode 110 is located at substantially the entire region of the lower surface of the semiconductor device 100. In other words, the lower electrode 110 is located in the diode region S1, the boundary region S2, and the IGBT region S3. The lower electrode 110 functions as a cathode electrode in the diode region S1 and functions as a collector electrode in the IGBT region S3.

According to the embodiment, the $n^+$-type cathode layer 111 is located on a portion of the lower electrode 110 that is positioned in the diode region S1 and the boundary region S2.

According to the embodiment, the $p^+$-type collector layer 112 is located on a portion of the lower electrode 110 that is positioned in the IGBT region S3, and is not located in the diode region S1 and the boundary region S2. In other words, according to the embodiment, the boundary region S2 is a constant region from the boundary between the $n^+$-type cathode layer 111 and the $p^+$-type collector layer 112 toward the diode region S1.

Although a length D1 of the boundary region S2 in the direction from the diode region S1 toward the IGBT region S3, i.e., the X-direction, is not particularly limited, it is favorable for the length D1 to be less than a distance D2 between the upper electrode 150 and the lower electrode 110.

The n-type layer 113 is located in the diode region S1, the boundary region S2, and the IGBT region S3. According to the embodiment, the n-type layer 113 is located on the $n^+$-type cathode layer 111 in the diode region S1 and the boundary region S2 and is located on the $p^+$-type collector layer 112 in the IGBT region.

The n-type layer 113 includes an n-type buffer region 114a and an $n^-$-type base region 114b.

The n-type buffer region 114a is located in the diode region S1, the boundary region S2, and the IGBT region S3. According to the embodiment, the n-type buffer region 114a is located on the $n^+$-type cathode layer 111 in the diode region S1 and the boundary region S2 and is located on the $p^+$-type collector layer 112 in the IGBT region. The impurity concentration of the n-type buffer region 114a is less than the impurity concentration of the $n^+$-type cathode layer 111. However, an n-type buffer region may not be included in the semiconductor device.

The $n^-$-type base region 114b is located on the n-type buffer region 114a in the diode region S1, the boundary region S2, and the IGBT region S3. The impurity concentration of the $n^-$-type base region 114b is less than the impurity concentration of the n-type buffer region 114a.

The n-type barrier layer 115 is located at the upper layer portion of the $n^-$-type base region 114b in the boundary region S2 and the IGBT region S3. According to the embodiment, the n-type barrier layer 115 is not located in the diode region S1. The impurity concentration of the n-type barrier layer 115 is greater than the impurity concentration of the $n^-$-type base region 114b. In other words, the impurity concentration of the n-type barrier layer 115 is greater than the impurity concentration of the upper layer portion of the n-type layer 113.

The p-type layer 116 is located in the diode region S1, the boundary region S2, and the IGBT region S3. In the diode region S1, the p-type layer 116 is located on the $n^-$-type base region 114b and contacts the $n^-$-type base region 114b. In the boundary region S2 and the IGBT region S3, the p-type layer 116 is located on the n-type barrier layer 115 and contacts the n-type barrier layer 115.

The p-type layer 116 includes a p-type region 116a and multiple p$^+$-type regions 116b. In the diode region S1, the p-type region 116a is located on the n$^-$-type base region 114b and contacts the n$^-$-type base region 114b. In the boundary region S2 and the IGBT region S3, the p-type region 116a is located on the n-type barrier layer 115 and contacts the n-type barrier layer 115. The p-type region 116a functions as a p-type anode layer in the diode region S1 and functions as a p-type base layer in the IGBT region S3.

The p$^+$-type regions 116b each are located at the upper layer portion of the p-type region 116a. The multiple p$^+$-type regions 116b are separated from each other in the X-direction. The p$^+$-type region 116b functions as a p$^+$-type anode layer in the diode region S1 and functions as a p$^+$-type contact layer in the IGBT region S3.

According to the embodiment, a length L1 in the X-direction of each p$^+$-type region 116b located in the boundary region S2 is substantially equal to a length L2 in the X-direction of each p$^+$-type region 116b located in the diode region S1. According to the embodiment, the length in the Y-direction of each p$^+$-type region 116b located in the boundary region S2 is substantially equal to the length in the Y-direction of each p$^+$-type region 116b located in the diode region S1. Accordingly, when viewed from above, that is, when viewed along the direction from the upper electrode 150 toward the lower electrode 110, the surface area of each p$^+$-type region 116b located in the boundary region S2 is substantially equal to the surface area of each p$^+$-type region 116b located in the diode region S1. However, the relationship between the length in the X-direction of each p$^+$-type region located in the boundary region and the length in the X-direction of each p$^+$-type region located in the diode region and the relationship between the length in the Y-direction of each p$^+$-type region located in the boundary region and the length in the Y-direction of each p$^+$-type region located in the diode region are not limited to those described above.

The n$^+$-type emitter layer 117 is located at the upper layer portion of the p-type layer 116 in the IGBT region S3 and is not located in the diode region S1 and the boundary region S2.

The p$^+$-type collector layer 112, the n-type buffer region 114a, the n$^-$-type base region 114b, the n-type barrier layer 115, the p-type layer 116, and the n$^+$-type emitter layer 117 include a semiconductor material such as silicon, etc.

Multiple trenches T1 are located in the diode region S1. The multiple trenches T1 are arranged in the X-direction. The trenches T1 each extend into the n$^-$-type base region 114b from the upper surface of the p-type layer 116, and more specifically, the upper surfaces of the p$^+$-type regions 116b. The lower end of each trench T1 is positioned higher than the lower surface of the n$^-$-type base region 114b.

The internal electrode 122 is located in each trench T1. The internal electrodes 122 each are made from a conductive material such as a metal material, etc. The internal electrodes 122 each extend into the n$^-$-type base region 114b from the upper surface of the p-type layer 116, and more specifically, the upper surface of each p$^+$-type region 116b. The lower end of each internal electrode 122 is positioned higher than the lower surface of the n$^-$-type base region 114b. Each internal electrode 122 is next to the p-type layer 116 and the n$^-$-type base region 114b in the X-direction.

Multiple trenches T2a are located in the IGBT region S3. One of the multiple trenches T2a is illustrated in FIG. 1. The multiple trenches T2a are arranged in the X-direction. The trenches T2a each extend from the upper surface of the n$^+$-type emitter layer 117 into the n$^-$-type base region 114b. The lower end of each trench T2a is positioned higher than the lower surface of the n$^-$-type base region 114b.

The gate electrode 131 is located in each trench T2a. The gate electrodes 131 each are made from a conductive material such as a metal material, etc. The gate electrodes 131 each extend from the upper surface of the n$^+$-type emitter layer 117 into the n$^-$-type base region 114b. The lower end of each gate electrode 131 is positioned higher than the lower surface of the n$^-$-type base region 114b. Each gate electrode 131 is next to the n$^+$-type emitter layer 117, the p-type layer 116, the n-type barrier layer 115, and the n$^-$-type base region 114b in the X-direction.

A trench T2b also is located in the IGBT region S3. The trench T2b is located further than multiple trenches T2 toward the boundary region S2. The trench T2b extends from the upper surface of the p-type layer 116 into the n$^-$-type base region 114b. The lower end of the trench T2b is positioned higher than the lower surface of the n$^-$-type base region 114b.

The internal electrode 132 is located in the trench T2b. The internal electrode 132 is made from a conductive material such as a metal material, etc. The internal electrode 132 extends into the n$^-$-type base region 114b from the upper surface of the p-type layer 116, and more specifically, the upper surface of the p$^+$-type region 116b. The lower end of the internal electrode 132 is positioned higher than the lower surface of the n$^-$-type base region 114b. The internal electrode 132 is next to the p-type layer 116, the n-type barrier layer 115, and the n$^-$-type base region 114b in the X-direction.

Multiple trenches T3 are located in the boundary region S2. The multiple trenches T3 are arranged in the X-direction. The trenches T3 each extend into the n$^-$-type base region 114b from the upper surface of the p-type layer 116, and more specifically, the upper surface of each p$^+$-type region 116b. The lower end of each trench T3 is positioned higher than the lower surface of the n$^-$-type base region 114b.

The gate electrode 141 is located in each trench T3. The gate electrodes 141 each are made from a conductive material such as a metal material, etc. The gate electrodes 141 each extend from the upper surface of the p-type layer 116 into the n$^-$-type base region 114b. The lower end of each gate electrode 141 is positioned higher than the lower surface of the n$^-$-type base region 114b. Each gate electrode 141 is next to the p-type layer 116, the n-type barrier layer 115, and the n$^-$-type base region 114b in the X-direction. Accordingly, according to the embodiment, the region of the semiconductor device 100 in which the n-type barrier layer 115 that is next to the gate electrode 141 is located corresponds to the boundary region S2.

Although an example is shown in FIG. 1 in which the number of the gate electrodes 141 located in the boundary region S2 is two, the number of the gate electrodes 141 located in the boundary region S2 is not limited to two.

The upper electrode 150 is made from a conductive material such as a metal material, etc. The upper electrode 150 is located on the p-type layer 116 in the diode region S1, the boundary region S2, and the IGBT region S3. The upper electrode 150 is located on the internal electrode 122 in the diode region S1, located on the gate electrode 141 in the boundary region S2, and located on the gate electrode 131 and the internal electrode 132 in the IGBT region S3. The upper electrode 150 functions as an anode electrode in the diode region S1 and functions as an emitter electrode in the IGBT region S3.

The insulating films 161 are located between the upper electrode 150 and the internal electrodes 122, between the p-type layer 116 and the internal electrodes 122, and between the n⁻-type base region 114b and the internal electrodes 122 in the diode region S1.

The insulating films 162 are located between the upper electrode 150 and the gate electrodes 131, between the n⁺-type emitter layer 117 and the gate electrodes 131, between the p-type layer 116 and the gate electrodes 131, between the n-type barrier layer 115 and the gate electrodes 131, and between the n⁻-type base region 114b and the gate electrodes 131 in the IGBT region S3.

The insulating films 163 are located between the internal electrode 132 and the upper electrode 150, between the internal electrode 132 and the p-type layer 116, and between the internal electrode 132 and the n⁻-type base region 114b in the IGBT region S3.

The insulating films 164 are located between the upper electrode 150 and the gate electrodes 141, between the p-type layer 116 and the gate electrodes 141, between the n-type barrier layer 115 and the gate electrodes 141, and between the n⁻-type base region 114b and the gate electrodes 141 in the boundary region S2. According to the embodiment, the insulating films 164 each contact the n-type barrier layer 115.

The insulating films 161, 162, 163, and 164 each are made from an insulating material such as silicon oxide, silicon nitride, etc.

According to the embodiment, the trenches T1, T2a, T2b, and T3 are arranged at a substantially constant spacing in the X-direction. Accordingly, according to the embodiment, a distance L3 in the X-direction between two adjacent gate electrodes 141 in the boundary region S2 is substantially equal to a distance L4 in the X-direction between two adjacent internal electrodes 122 in the diode region S1. However, the relationship between the distance L3 and the distance L4 is not limited to that described above.

The internal electrodes 122 and 132 are electrically connected to the upper electrode 150 in the semiconductor device 100. The gate electrode 131 is not electrically connected to the internal electrodes 122 and 132 and the upper electrode 150 in the semiconductor device 100. In other words, the gate electrode 131 is electrically insulated from the internal electrodes 122 and 132 and the upper electrode 150. The gate electrode 141 is not electrically connected to the internal electrodes 122 and 132, the upper electrode 150, or the gate electrode 131 in the semiconductor device 100. In other words, the gate electrode 141 is electrically insulated from the internal electrodes 122 and 132, the upper electrode 150, and the gate electrode 131. However, all of the internal electrodes 122 may be electrically insulated from the upper electrode 150 and the gate electrode 131 and electrically connected to the gate electrode 141. Also, some of the multiple internal electrodes 122 may be electrically insulated from the upper electrode 150 and the gate electrode 131 and electrically connected to the gate electrode 141.

A usage example of the semiconductor device 100 according to the embodiment will now be described.

Figure 2:
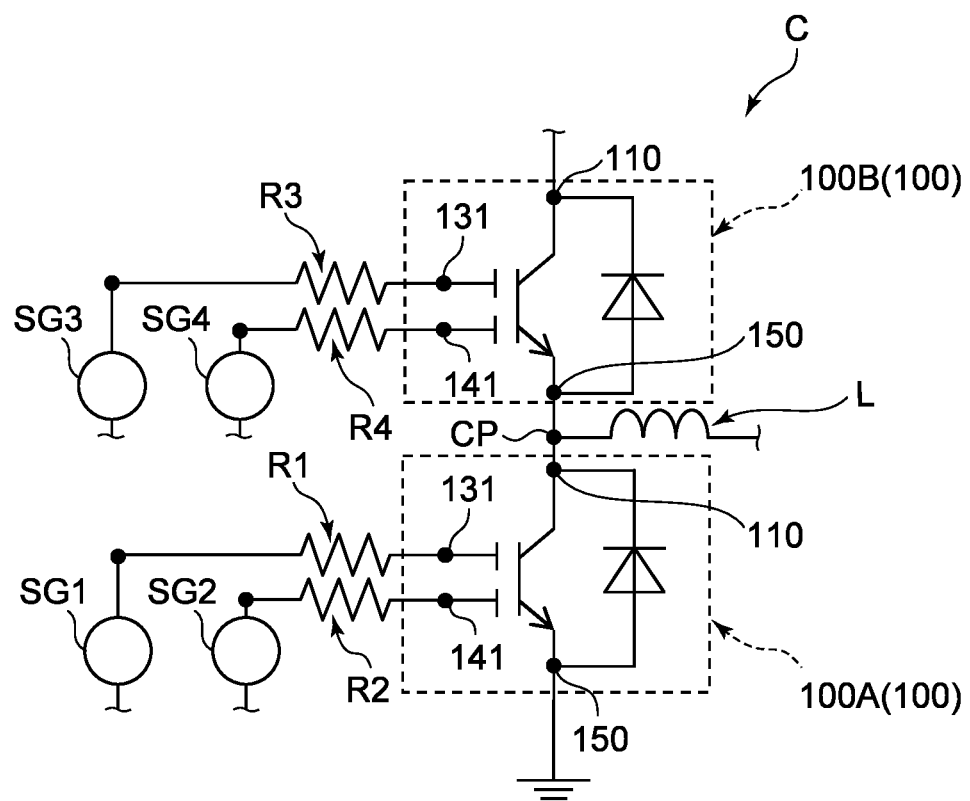
FIG. 2 is a circuit diagram showing a half-bridge circuit in which the semiconductor device according to the first embodiment is embedded.

FIG. 2 is a circuit diagram showing a half-bridge circuit in which the semiconductor device according to the embodiment is embedded.

Two semiconductor devices 100 can be embedded in a half-bridge circuit C. Hereinbelow, one of the two semiconductor devices 100 embedded in the half-bridge circuit C is also called a "first semiconductor device 100A"; and the other is also called a "second semiconductor device 100B".

The lower electrode 110, i.e., the collector electrode, of the first semiconductor device 100A is electrically connected to the upper electrode 150, i.e., the emitter electrode, of the second semiconductor device 100B. One terminal of a load L such as a motor or the like is electrically connected to a connection point CP between the lower electrode 110 of the first semiconductor device 100A and the upper electrode 150 of the second semiconductor device 100B.

The gate electrode 131 of the IGBT region S3 of the first semiconductor device 100A is electrically connected to a first signal source SG1 via a resistance R1, etc. The gate electrode 141 of the boundary region S2 of the first semiconductor device 100A is electrically connected via a resistance R2, etc., to a second signal source SG2 other than the first signal source SG1. The gate electrode 131 of the IGBT region S3 of the second semiconductor device 100B is electrically connected to a third signal source SG3 via a resistance R3, etc. The gate electrode 141 of the boundary region S2 of the second semiconductor device 100B is electrically connected via a resistance R4, etc., to a fourth signal source SG4 other than the third signal source SG3.

Figure 3A:
FIG. 3A is a graph showing the temporal change of the voltage between a gate electrode of an IGBT region and an emitter electrode of a first semiconductor device shown in FIG. 2, in which the horizontal axis is time, and the vertical axis is the voltage.

FIG. 3A is a graph showing the temporal change of the voltage between the gate electrode of the IGBT region and an emitter electrode of the first semiconductor device shown in FIG. 2, in which the horizontal axis is time, and the vertical axis is the voltage.

Figure 3B:
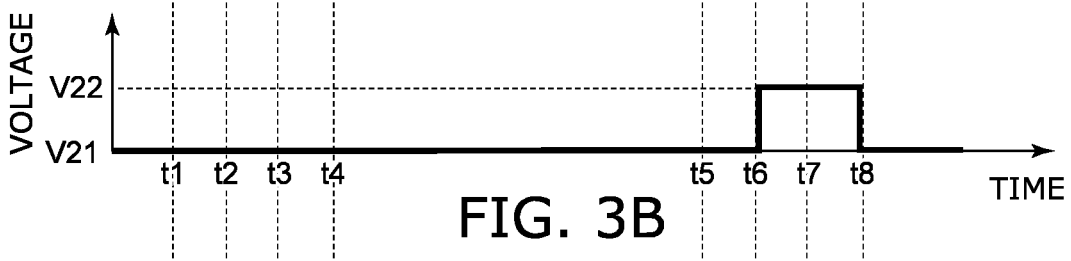
FIG. 3B is a graph showing the temporal change of the voltage between a gate electrode of a boundary region and the emitter electrode of the first semiconductor device, in which the horizontal axis is time, and the vertical axis is the voltage.

FIG. 3B is a graph showing the temporal change of the voltage between the gate electrode of the boundary region and the emitter electrode of the first semiconductor device, in which the horizontal axis is time, and the vertical axis is the voltage.

Figure 3C:
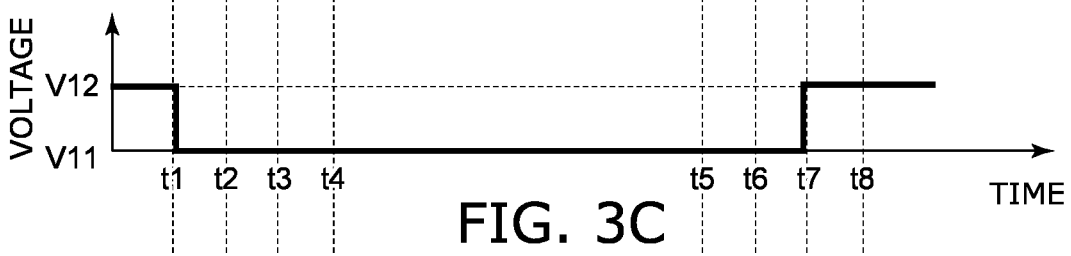
FIG. 3C is a graph showing the temporal change of the voltage between a gate electrode of an IGBT region and an emitter electrode of a second semiconductor device shown in FIG. 2, in which the horizontal axis is time, and the vertical axis is the voltage.

FIG. 3C is a graph showing the temporal change of the voltage between the gate electrode of the IGBT region and an emitter electrode of the second semiconductor device shown in FIG. 2, in which the horizontal axis is time, and the vertical axis is the voltage.

Figure 3D:
FIG. 3D is a graph showing the temporal change of the voltage between a gate electrode of a boundary region and the emitter electrode of the second semiconductor device, in which the horizontal axis is time, and the vertical axis is the voltage.

FIG. 3D is a graph showing the temporal change of the voltage between the gate electrode of the boundary region and the emitter electrode of the second semiconductor device, in which the horizontal axis is time, and the vertical axis is the voltage.

Figure 3E:
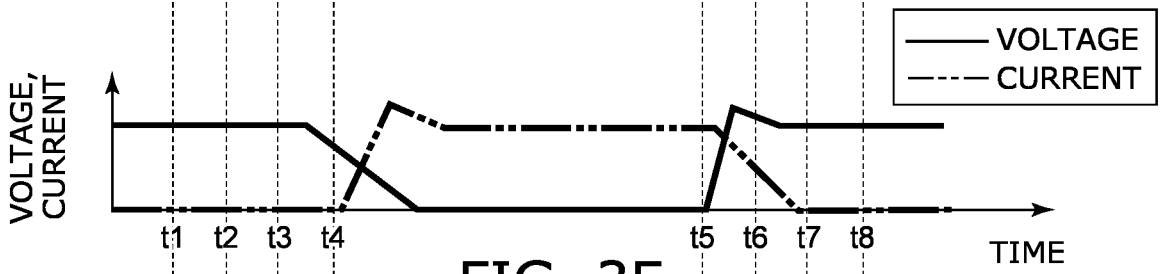
FIG. 3E is a graph showing the temporal change of a collector current and the temporal change of the voltage between a collector electrode and an emitter electrode of the first semiconductor device, in which the horizontal axis is time, and the vertical axis is the voltage and the current.

FIG. 3E is a graph showing the temporal change of the collector current and the temporal change of the voltage between the collector electrode and the emitter electrode of the first semiconductor device, in which the horizontal axis is time, and the vertical axis is the voltage and the current.

Figure 3F:
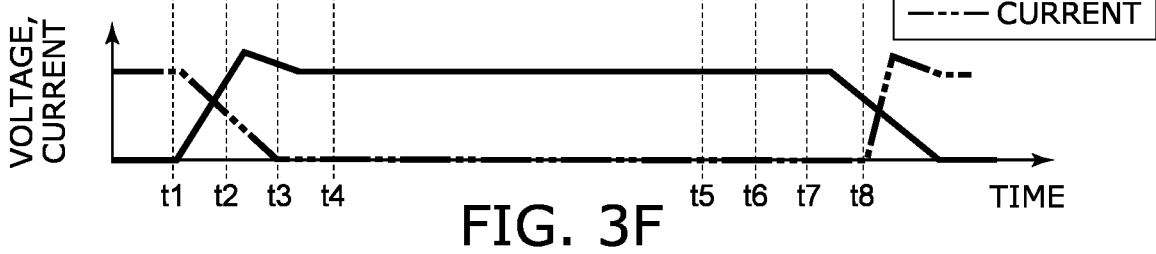
FIG. 3F is a graph showing the temporal change of a collector current and the temporal change of the voltage between a collector electrode and an emitter electrode of the second semiconductor device, in which the horizontal axis is time, and the vertical axis is the voltage and the current.

FIG. 3F is a graph showing the temporal change of the collector current and the temporal change of the voltage between the collector electrode and the emitter electrode of the second semiconductor device, in which the horizontal axis is time, and the vertical axis is the voltage and the current.

Figure 4A:
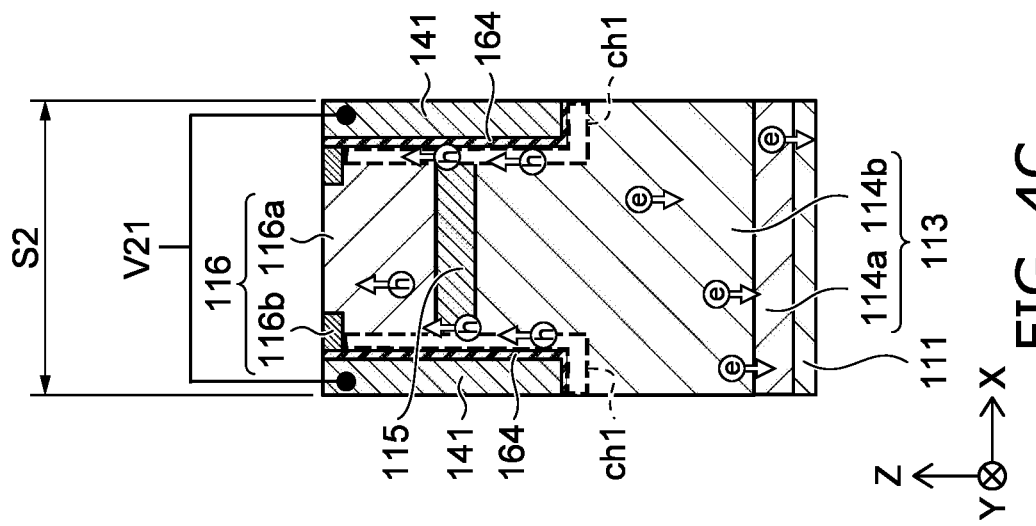
FIG. 4A is a schematic view showing operations of the boundary region.
Figure 4B:
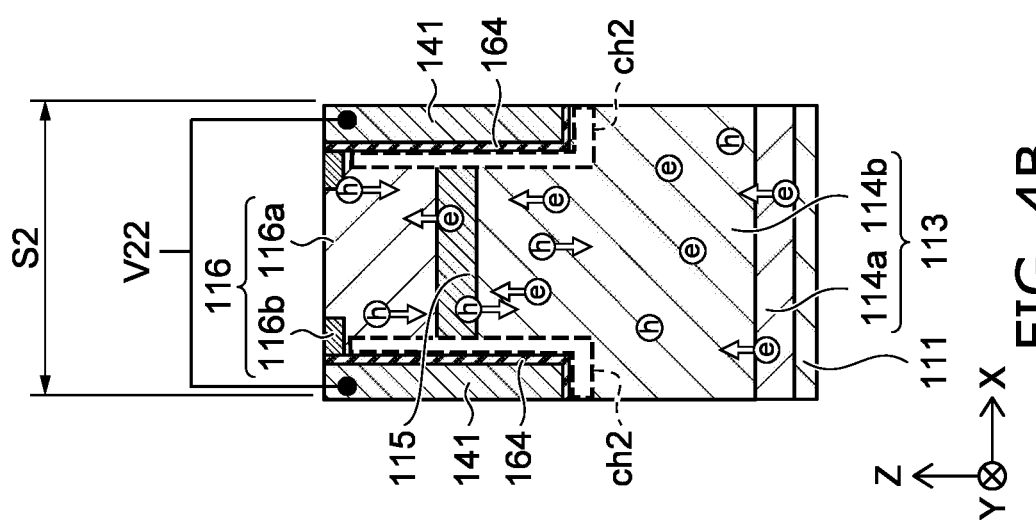
FIG. 4B is a schematic view showing operations of the boundary region.
Figure 4C:
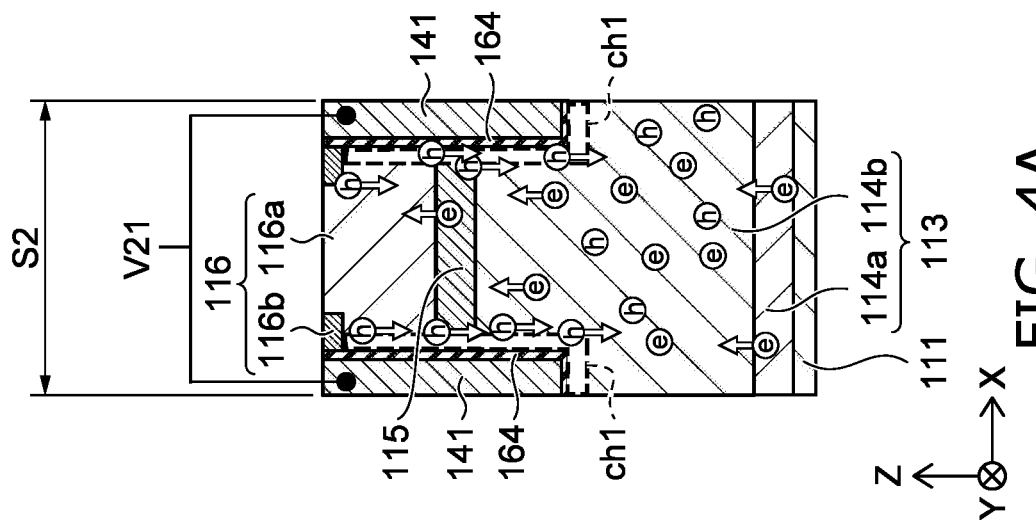
FIG. 4C is a schematic view showing operations of the boundary region.

FIGS. 4A to 4C are schematic views showing operations of the boundary region.

In FIGS. 4A to 4C, a hole is shown by an "h" surrounded with a circle, and an electron is shown by an "e" surrounded with a circle. The movement directions of the holes and the electrons are shown by arrows. Further, hereinafter, applying the voltage between the gate electrodes 131,141 and the upper electrode 150 so that the potential of the gate electrodes 131,141 becomes higher than the potential of the upper electrode 150, is also referred to as "applying the positive voltage to the gate electrodes 131,141". Similarly, applying the voltage between the gate electrodes 131,141 and the upper electrode 150 so that the potential of the gate electrodes 131,141 becomes lower than the potential of the upper electrode 150, is also referred to as "applying the negative voltage to the gate electrodes 131,141".

First, a state before a time t1 will be described.

As shown in FIG. 3A, the first signal source SG1 applies a voltage V11 to the gate electrode 131 of the IGBT region S3 of the first semiconductor device 100A before the time t1. Here, the voltage V11 is a voltage that is less than a threshold that forms an n-type channel in the p-type layer 116 of the IGBT region S3 and is, for example, a negative voltage. Therefore, before the time t1, the IGBT region S3 of the first semiconductor device 100A is in the off-state as shown in FIG. 3E.

As shown in FIG. 3B, the second signal source SG2 applies a voltage V21 to the gate electrode 141 of the boundary region S2 of the first semiconductor device 100A before the time t1. Here, the voltage V21 is a voltage that is less than a threshold that forms a p-type inversion layer in the n-type barrier layer 115 of the boundary region S2 and is, for example, a negative voltage. Accordingly, a p-type inversion layer is formed in the portion of the n-type barrier layer 115 that is positioned at the vicinity of the gate electrode 141.

As shown in FIG. 3C, the third signal source SG3 applies a voltage V12 to the gate electrode 131 of the IGBT region S3 of the second semiconductor device 100B before the time t1. Here, the voltage V12 is a voltage that is greater than a threshold that forms an n-type channel in the p-type layer 116 of the IGBT region S3 and is, for example, a positive voltage. Therefore, before the time t1, the IGBT region S3 of the second semiconductor device 100B is in the on-state as shown in FIG. 3F.

As shown in FIG. 3D, the fourth signal source SG4 applies the voltage V21 to the gate electrode 141 of the boundary region S2 of the second semiconductor device 100B before the time t1. Accordingly, a p-type inversion layer is formed in the portion of the n-type barrier layer 115 that is positioned at the vicinity of the gate electrode 141.

As shown in FIG. 3C, the third signal source SG3 switches the voltage applied to the gate electrode 131 of the IGBT region S3 of the second semiconductor device 100B from the voltage V12 to the voltage V11 at the time t1. Thereby, as shown in FIG. 3F, the IGBT region S3 of the second semiconductor device 100B is switched from the on-state to the off-state. Then, a return current starts to flow in the diode region S1 and the boundary region S2 of the first semiconductor device 100A. In other words, the diode region S1 and the boundary region S2 of the first semiconductor device 100A are switched on.

At this time as shown in FIG. 3B, the second signal source SG2 continues to apply the voltage V21 to the gate electrode 141 of the boundary region S2 of the first semiconductor device 100A. Therefore, as shown in FIG. 4A, the p-type inversion layer continues to be formed in the portion of the n-type barrier layer 115 that is positioned at the vicinity of the gate electrode 141. Accordingly, a p-type channel ch1 that includes this inversion layer is formed in the portions of the p-type layer 116, the n-type barrier layer 115, and the n-type layer 113 of the boundary region S2 that are positioned at the periphery of the gate electrode 141. Holes are easily injected into an $n^-$-base layer 114 from the p-type layer 116, and particularly from the $p^+$-type region 116b, via the p-type channel ch1. Therefore, the amount of the carriers in the $n^-$-base layer 114 is increased. Thereby, the on-resistances of the diode region S1 and the boundary region S2 of the first semiconductor device 100A can be reduced. As a result, the steady losses of the diode region S1 and the boundary region S2 of the first semiconductor device 100A can be reduced.

Then, as shown in FIG. 3D, the fourth signal source SG4 switches the voltage applied to the gate electrode 141 of the boundary region S2 of the second semiconductor device 100B from the voltage V21 to a voltage V22 at a time t2 before the recovery of the diode region S1 and the boundary region S2 of the second semiconductor device 100B starts. Here, the voltage V22 is a voltage that is greater than a threshold that forms a p-type channel in the n-type barrier layer 115 and is, for example, a positive voltage. Therefore, as shown in FIG. 4B, an n-type channel ch2 is formed in the portions of the n-type barrier layer 115 and the n-type layer 113 of the boundary region S2 that are positioned at the periphery of the gate electrode 141. In particular, the portion of the n-type barrier layer 115 that is positioned at the vicinity of the gate electrode 141 functions as an n-type accumulation layer. As a result, holes are not easily injected into the $n^-$-type base layer 114 from the p-type layer 116, and particularly from the $p^+$-type region 116b. The voltage V22 may be a voltage that is greater than a threshold that forms an n-type channel in the p-type layer 116. In such a case, an n-type channel is also formed in the p-type layer 116; and holes are even less easily injected into the $n^-$-type base layer 114. Thereby, the increase of the amount of the carriers in the $n^-$-type base region 114b can be suppressed before the recovery of the diode region S1 and the boundary region S2 of the second semiconductor device 100B starts. As a result, the recovery loss of the second semiconductor device 100B can be reduced.

Then, as shown in FIG. 3A, the first signal source SG1 switches the voltage applied to the gate electrode 131 of the IGBT region S3 of the first semiconductor device 100A from the voltage V11 to the voltage V12 at a time t3. Thereby, as shown in FIG. 3E, the IGBT region S3 of the first semiconductor device 100A is switched from the off-state to the on-state.

Figure 5A:
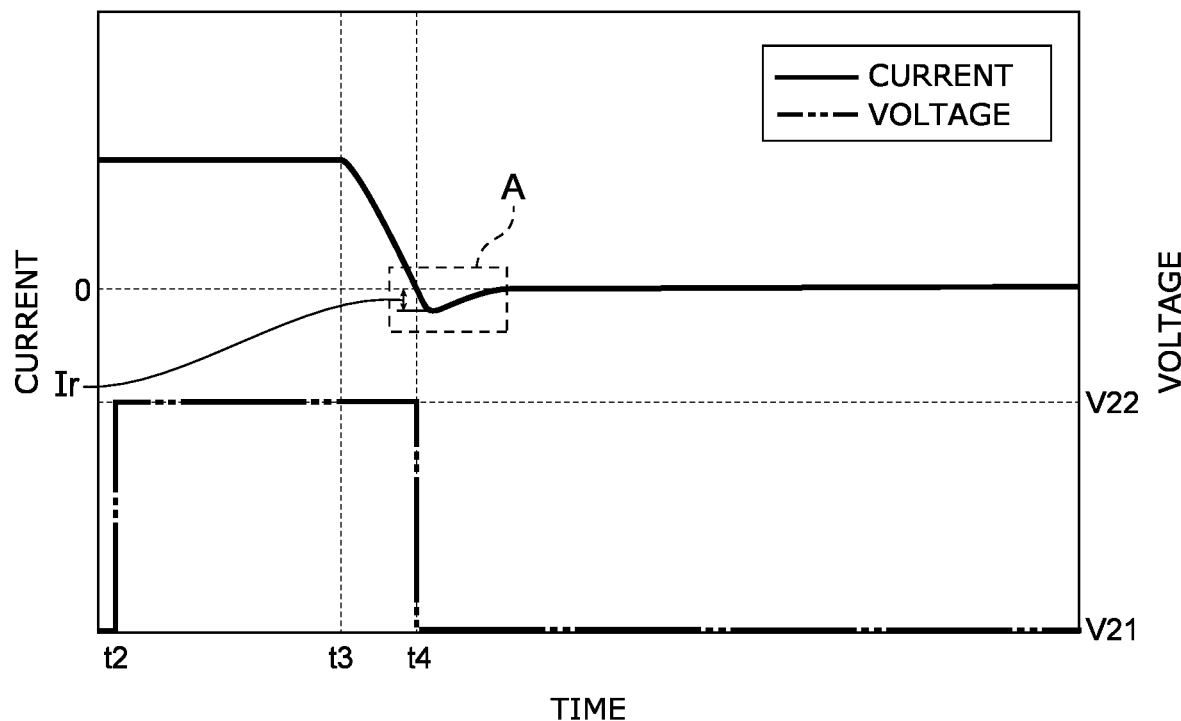
FIG. 5A is a graph showing the relationship between the temporal change of the current flowing through the diode region and the boundary region and the temporal change of the voltage between the gate electrode of the boundary region and the emitter electrode, in which the horizontal axis is time, and the vertical axis is the current and the voltage.
Figure 5B:
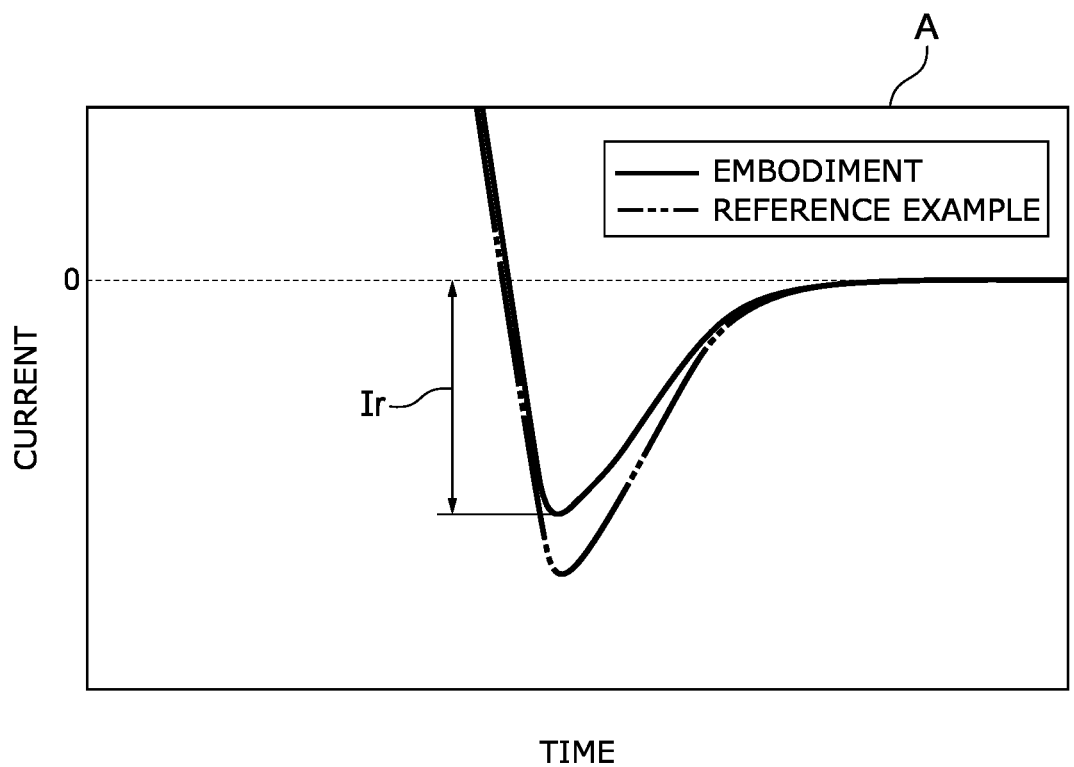
FIG. 5B is a graph showing the temporal change of the current flowing through the diode region and the boundary region of the first embodiment and the temporal change of the current flowing through a diode region and a boundary region of a reference example, in which a portion surrounded with broken line A in FIG. 5A is enlarged, the horizontal axis is time, and the vertical axis is the current.

FIG. 5A is a graph showing the relationship between the temporal change of the current flowing through the diode region and the boundary region and the temporal change of the voltage between the gate electrode of the boundary region and the emitter electrode, in which the horizontal axis is time, and the vertical axis is the current and the voltage; and FIG. 5B is a graph showing the temporal change of the current flowing through the diode region and the boundary region of the embodiment and the temporal change of the current flowing through a diode region and a boundary region of a reference example, in which a portion surrounded with broken line A in FIG. 5A is enlarged, the horizontal axis is time, and the vertical axis is the current.

As shown in FIG. 5A, the recovery of the diode region S1 and the boundary region S2 of the second semiconductor device 100B is started by switching the IGBT region S3 of the first semiconductor device 100A from the off-state to the on-state at the time t3. The current that flows through the diode region S1 and the boundary region S2 of the second semiconductor device 100B gradually decreases at and after the time t3; and a reverse recovery current starts to flow from the lower electrode 110 toward the upper electrode 150 at and after a time t4. The fourth signal source SG4 applies the voltage V22 to the gate electrode 141 of the boundary region S2 of the second semiconductor device 100B up to the time t4 at which the reverse recovery current flows. Therefore, the n-type channel ch2 is formed in the portions of the p-type layer 116, the n-type barrier layer 115, and the n-type layer 113 of the boundary region S2 that are positioned at the periphery of the gate electrode 141 up to the time t4. Therefore, the injection of holes is suppressed up to the time t4. As a result, a peak value Ir of the reverse recovery current can be reduced. As a result, the recovery loss of the diode region S1 and the boundary region S2 of the first semiconductor device 100A can be reduced.

In the reference example shown in FIG. 5B, the voltage applied to the gate electrode 141 of the boundary region S2 of the second semiconductor device 100B is not switched from the voltage V21 to the voltage V22 at the time t2. In other words, the fourth signal source SG4 continues to apply the voltage V21 to the gate electrode 141. In such a case, the peak value of the reverse recovery current of the embodiment is greater than the peak value Ir of the reverse recovery current of the reference example.

Then, as shown in FIGS. 3D and 5A, the fourth signal source SG4 switches the voltage applied to the gate electrode 141 of the boundary region S2 of the second semiconductor device 100B from the voltage V22 to the voltage V21 at the time t4. Thereby, as shown in FIG. 4C, the p-type channel ch1 is re-formed in the p-type layer 116, the n-type barrier layer 115, and the n-type layer 113 of the boundary region S2. The ejection of holes from the n⁻-base layer 114 into the p-type layer 116 via the p-type channel ch1 is promoted. As a result, the recovery loss of the diode region S1 and the boundary region S2 of the second semiconductor device 100B can be reduced.

Then, as shown in FIG. 3A, the first signal source SG1 switches the voltage applied to the gate electrode 131 of the IGBT region S3 of the first semiconductor device 100A from the voltage V12 to the voltage V11 at a time t5. As a result, as shown in FIG. 3E, the IGBT region S3 of the first semiconductor device 100A is switched from the on-state to the off-state. Then, a return current starts to flow in the diode region S1 and the boundary region S2 of the second semiconductor device 100B. In other words, the diode region S1 and the boundary region S2 of the second semiconductor device 100B are switched on.

At this time as shown in FIG. 3D, the fourth signal source SG4 continues to apply the voltage V21 to the gate electrode 141 of the boundary region S2 of the second semiconductor device 100B. Therefore, as shown in FIG. 4A, the p-type channel ch1 is formed in the portions of the p-type layer 116, the n-type barrier layer 115, and the n-type layer 113 of the boundary region S2 that are positioned at the periphery of the gate electrode 141. Holes are easily injected into the n⁻-base layer 114 from the p-type layer 116, and particularly from the p⁺-type region 116b, via the p-type channel ch1. Therefore, the on-resistances of the diode region S1 and the boundary region S2 of the second semiconductor device 100B can be reduced. As a result, the steady losses of the diode region S1 and the boundary region S2 of the second semiconductor device 100B can be reduced.

Then, as shown in FIG. 3B, the second signal source SG2 switches the voltage applied to the gate electrode 141 of the boundary region S2 of the first semiconductor device 100A from the voltage V21 to the voltage V22 at a time t6 before the recovery of the diode region S1 and the boundary region S2 of the first semiconductor device 100A starts. Therefore, as shown in FIG. 4B, the n-type channel ch2 is formed in the portions of the n-type barrier layer 115 and the n-type layer 113 of the boundary region S2 that are positioned at the periphery of the gate electrode 141. Thereby, holes are not easily injected into the n⁻-type base layer 114 from the p-type layer 116, and particularly from the p⁺-type region 116b. The voltage V22 may be greater than a threshold that forms an n-type channel in the p-type layer 116. In such a case, an n-type channel is also formed in the p-type layer 116; and holes are even less easily injected into the n⁻-type base layer 114. As a result, the recovery loss of the diode region S1 and the boundary region S2 of the first semiconductor device 100A can be reduced.

Then, as shown in FIG. 3C, the third signal source SG3 switches the voltage applied to the gate electrode 131 of the IGBT region S3 of the second semiconductor device 100B from the voltage V11 to the voltage V12 at a time t7. Thereby, as shown in FIG. 3F, the IGBT region S3 of the second semiconductor device 100B is switched from the off-state to the on-state. Thereby, the recovery of the diode region S1 and the boundary region S2 of the first semiconductor device 100A is started.

Then, as shown in FIG. 3B, the second signal source SG2 switches the voltage applied to the gate electrode 141 of the boundary region S2 of the first semiconductor device 100A from the voltage V22 to the voltage V21 at a time t8 at which a reverse recovery current starts to flow in the diode region S1 and the boundary region S2 of the first semiconductor device 100A. Thereby, as shown in FIG. 4C, the p-type channel ch1 is re-formed in the portions of the p-type layer 116, the n-type barrier layer 115, and the n-type layer 113 of the boundary region S2 that are positioned at the periphery of the gate electrode 141. Holes are easily ejected from the n⁻-base layer 114 into the p-type layer 116 via the p-type channel ch1. As a result, the recovery loss of the diode region S1 and the boundary region S2 of the first semiconductor device 100A can be reduced.

The internal electrode is electrically connected to the upper electrode 150. Thus, in the conductive state of the diode region S1, a negative voltage with respect to the internal electrode 122 is applied to the gate electrode 141 in the boundary region S2. Before the recovery of the diode region S1, a positive voltage with respect to the internal electrode 122 is applied to the gate electrode 141. While the reverse recovery current is flowing in the diode region S1, a negative voltage with respect to the internal electrode 122 is applied to the gate electrode 141.

Thus, the trade-off relationship between the steady losses and recovery losses of the diode region S1 and the boundary region S2 of the first and second semiconductor devices 100A and 100B can be improved. The method for driving the semiconductor device 100 described above is an example; and the method for driving the semiconductor device 100 is not particularly limited to the method described above. For example, the time at which the fourth signal source SG4 switches the voltage applied to the gate electrode 141 of the boundary region S2 of the second semiconductor device 100B from the voltage V22 to the voltage V21 is not limited to the time t4 at which the reverse recovery current starts to flow. Similarly, the time at which the second signal source SG2 switches the voltage applied to the gate electrode 141 of the boundary region S2 of the first semiconductor device 100A from the voltage V22 to the voltage V21 is not limited to the time t8 at which the reverse recovery current starts to flow.

Effects of the embodiment will now be described.

In the semiconductor device 100 according to the embodiment, the n-type barrier layer 115 and the gate electrode 141 that is next to the n-type barrier layer 115 and is electrically insulated from the gate electrode 131 of the IGBT region S3 are located in the boundary region S2. Therefore, the trade-off relationship of the steady losses and recovery losses of the diode region S1 and the boundary region S2 of the semiconductor device 100 can be improved by adjusting the voltage applied to the gate electrode 141 of the boundary region S2 separately from the gate electrode 131 of the IGBT region S3. As a result, the losses of the diode region S1 and the boundary region S2 of the semiconductor device 100 can be reduced.

Compared to the diode region S1, current easily concentrates in the boundary region S2 in recovery, and the boundary region S2 is easily damaged in recovery. Conversely, according to the embodiment, the n-type barrier layer 115 and the gate electrode 141 are located in the boundary region S2. Therefore, the n-type barrier layer 115 can function as an n-type accumulation layer by adjusting the voltage that is applied to the gate electrode 141 before recovery starts. Thereby, the increase of the amount of the carriers in the n⁻-type base region 114b of the boundary region S2 can be suppressed before recovery starts. As a result, the damage of the boundary region S2 of the semiconductor device 100 in recovery can be suppressed.

According to the embodiment, the n-type barrier layer 115 and the gate electrode 141 are not located in the diode region S1. Therefore, the amount of the carriers in the diode region S1 can be prevented from being less than the amount of the carriers of the boundary region S2. An increase of the forward voltage of the diode region S1 can be suppressed thereby.

First Modification of First Embodiment

A modification of the first embodiment will now be described.

Figure 6:
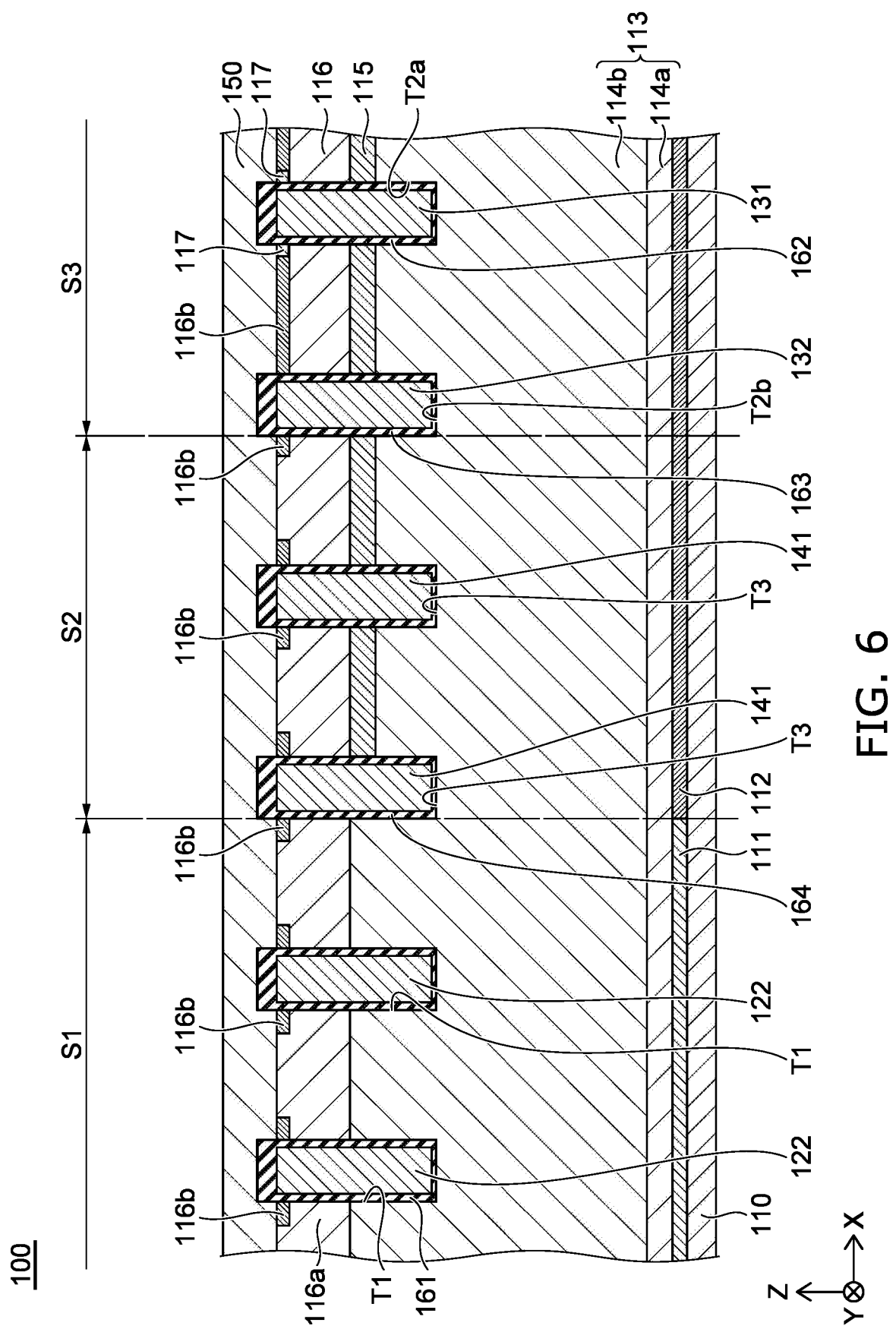
FIG. 6 is a cross-sectional view showing a first modification of the semiconductor device according to the first embodiment.

FIG. 6 is a cross-sectional view showing a first modification of the semiconductor device according to the first embodiment.

As a general rule in the following description, only the differences with the first embodiment are described. Other than the items described below, the modification is similar to the first embodiment. This is similar for the other modifications and embodiments described below as well.

An example is described in the first embodiment in which the n⁺-type cathode layer 111 is located on the lower electrode 110 in the boundary region S2. However, as shown in FIG. 6, the n⁺-type cathode layer 111 may not be located in the boundary region S2. The p⁺-type collector layer 112 may also be located in the boundary region S2; and the p⁺-type collector layer 112 may be located between the lower electrode 110 and the n-type layer 113 in the boundary region S2. In such a case, the boundary region S2 is a constant region from the boundary between the n⁺-type cathode layer 111 and the p⁺-type collector layer 112 toward the IGBT region S3 side.

In such a configuration as well, the trade-off relationship between the steady losses and recovery losses of the diode region S1 and the boundary region S2 can be improved. Also, in such a configuration as well, the damage of the boundary region S2 in recovery can be suppressed. In such a configuration as well, the reduction of the amount of the carriers of the diode region S1 can be suppressed.

Second Modification of First Embodiment

A second modification of the first embodiment will now be described.

Figure 7:
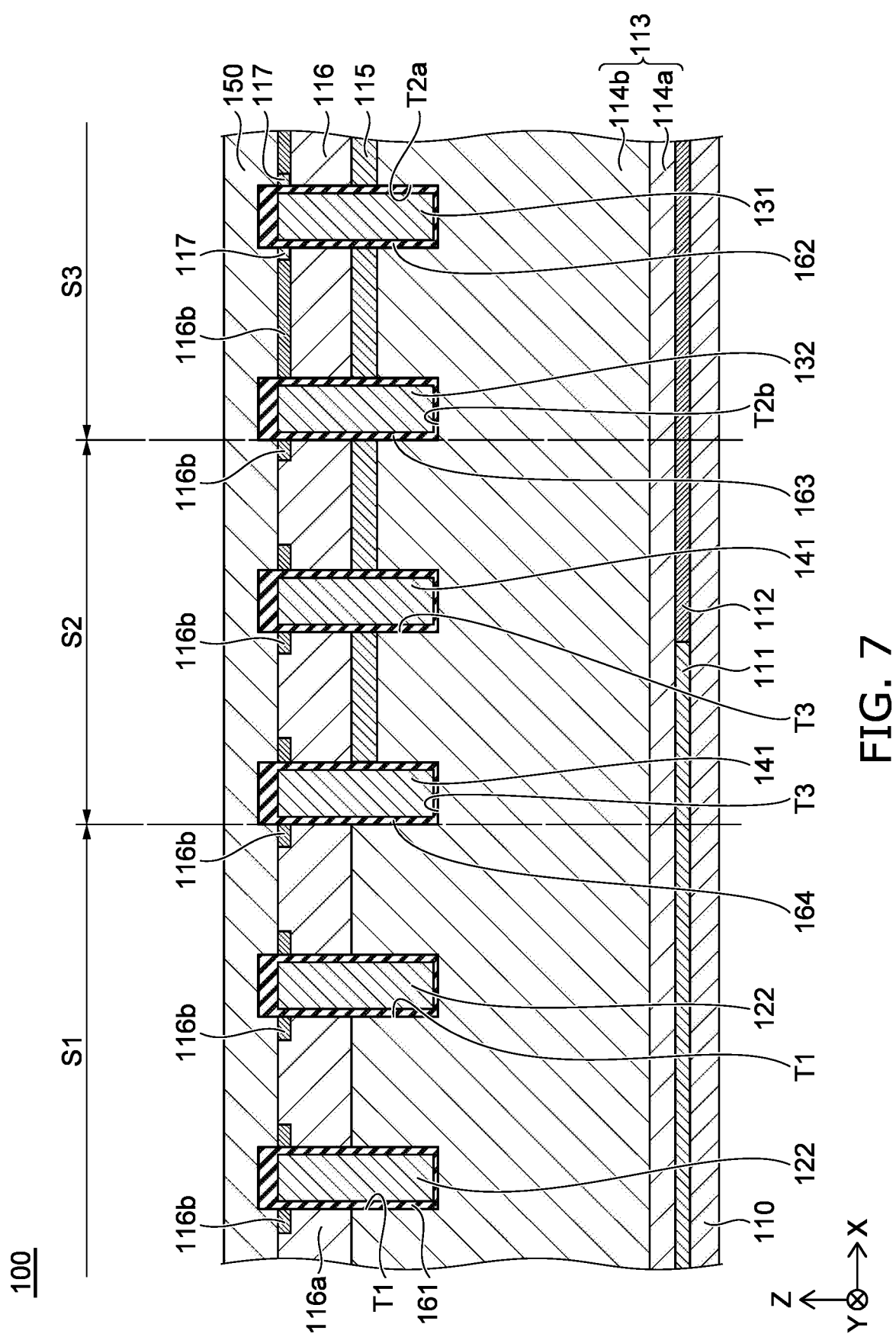
FIG. 7 is a cross-sectional view showing a second modification of the semiconductor device according to the first embodiment.

FIG. 7 is a cross-sectional view showing a second modification of the semiconductor device according to the first embodiment.

Both the n⁺-type cathode layer 111 and the p⁺-type collector layer 112 may be located in the boundary region S2; and both the n⁺-type cathode layer 111 and the p⁺-type collector layer 112 may be located between the lower electrode 110 and the n-type layer 113 in the boundary region S2.

In such a configuration as well, the trade-off relationship between the steady losses and recovery losses of the diode region S1 and the boundary region S2 can be improved. In such a configuration as well, the damage of the boundary region S2 in recovery can be suppressed. In such a configuration as well, the amount of the carriers in the diode region S1 can be prevented from being less than in the boundary region S2.

Second Embodiment

A second embodiment will now be described.

Figure 8:
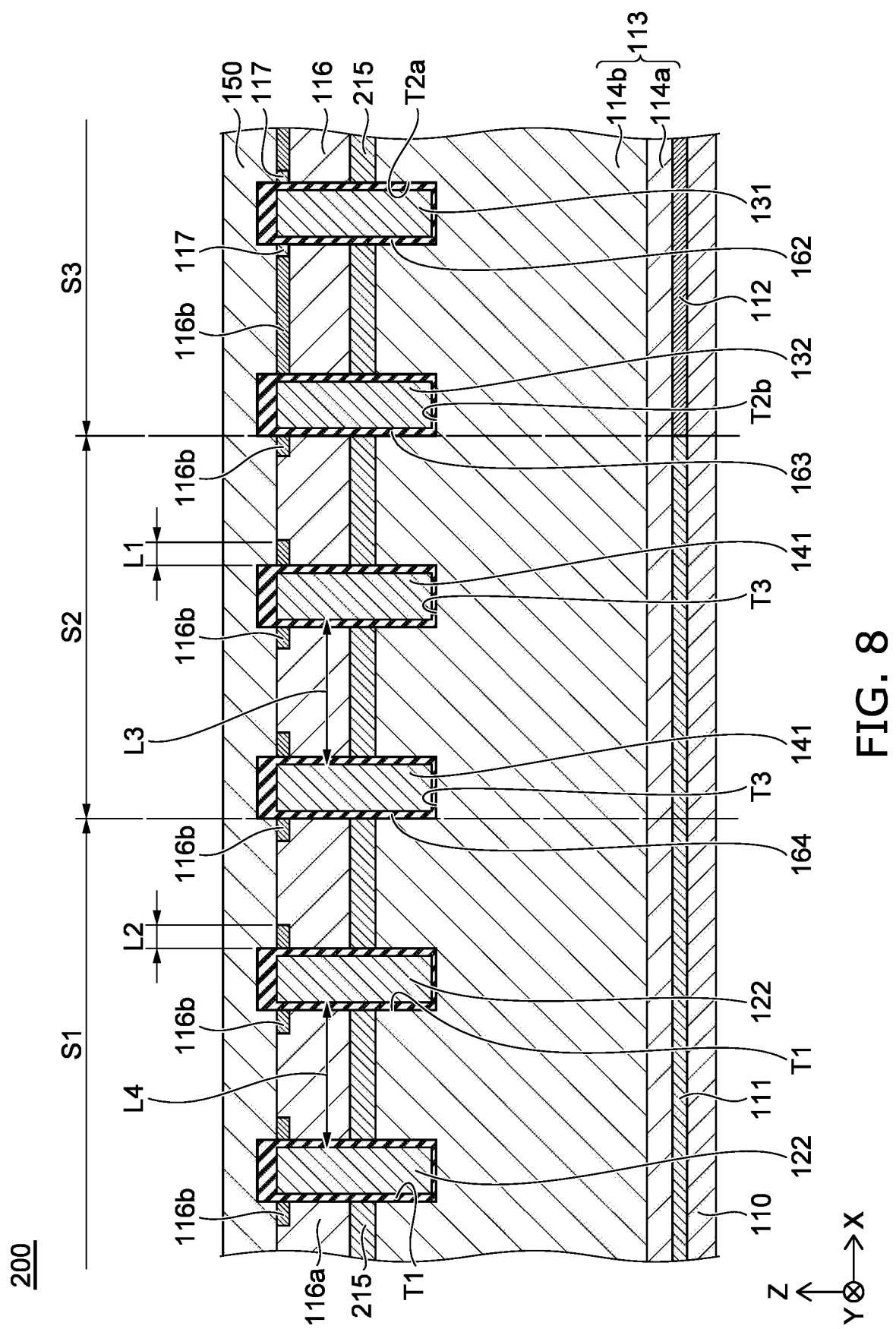
FIG. 8 is a cross-sectional view showing a semiconductor device according to a second embodiment.

FIG. 8 is a cross-sectional view showing a semiconductor device according to the embodiment.

In the semiconductor device 200 according to the embodiment, an n-type barrier layer 215 is also located in the diode region S1. According to the embodiment, the gate electrodes 141 are electrically insulated from the internal electrodes 122 of the diode region S1, and from the gate electrodes 131 and the internal electrodes 132 of the IGBT region S3.

Thus, the gate electrode 141 may be electrically insulated from the internal electrode 122; and the n-type barrier layer 215 may also be located in the diode region S1. In such a configuration as well, the trade-off relationship between the steady losses and recovery losses of the diode region S1 and the boundary region S2 can be improved. In such a configuration as well, the damage of the boundary region S2 in recovery can be suppressed.

According to the embodiment, the internal electrode 122 that is next to the n-type barrier layer 215 in the diode region S1 is electrically insulated from the gate electrode 141. Therefore, the amount of the carriers in the diode region S1 can be prevented from being less than the amount of the carriers of the boundary region S2.

First Modification of Second Embodiment

A first modification of a second embodiment will now be described.

Figure 9A:
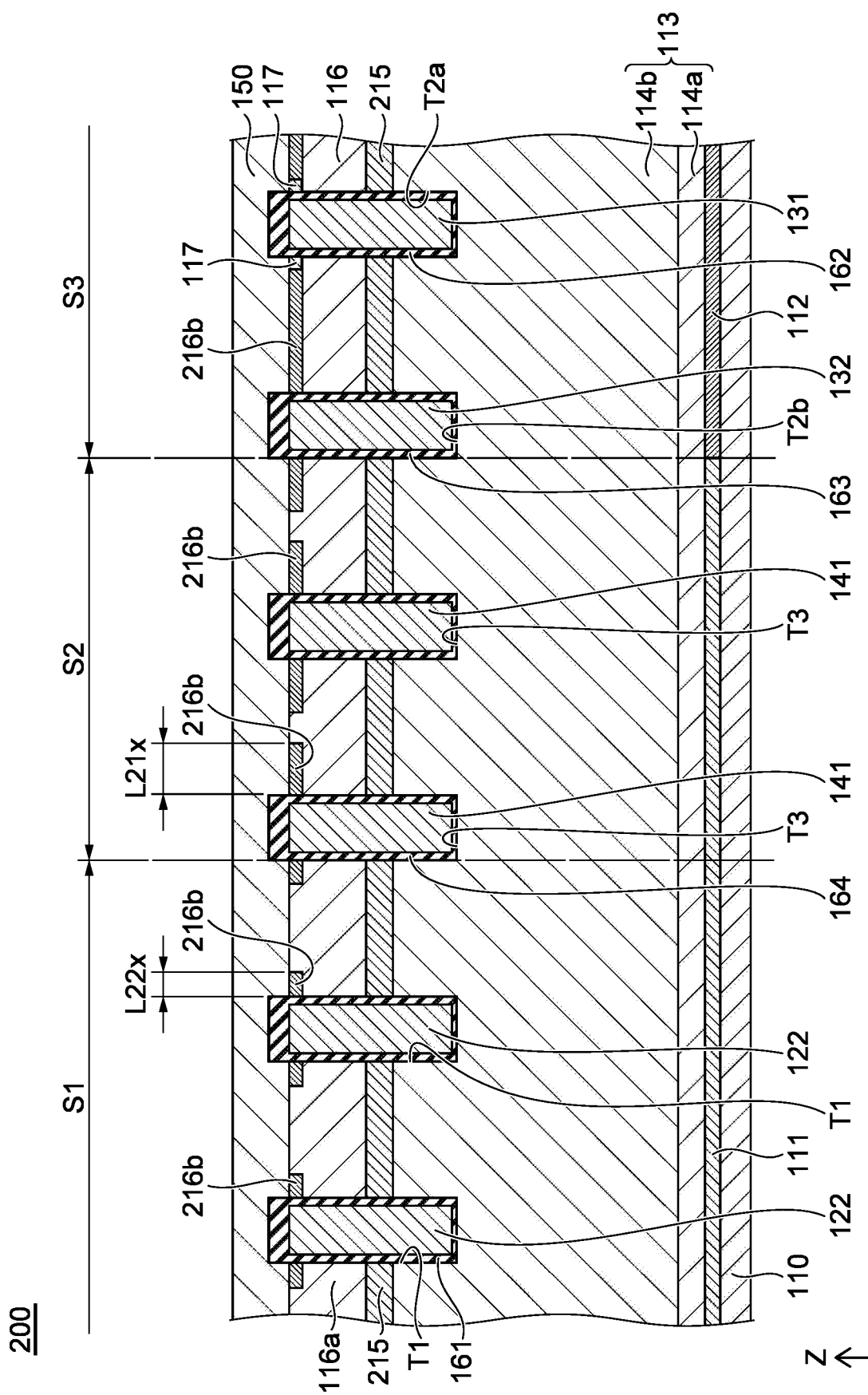
FIG. 9A is a cross-sectional view showing a first modification of the semiconductor device according to the second embodiment.

FIG. 9A is a cross-sectional view showing a first modification of the semiconductor device according to the second embodiment.

Figure 9B:
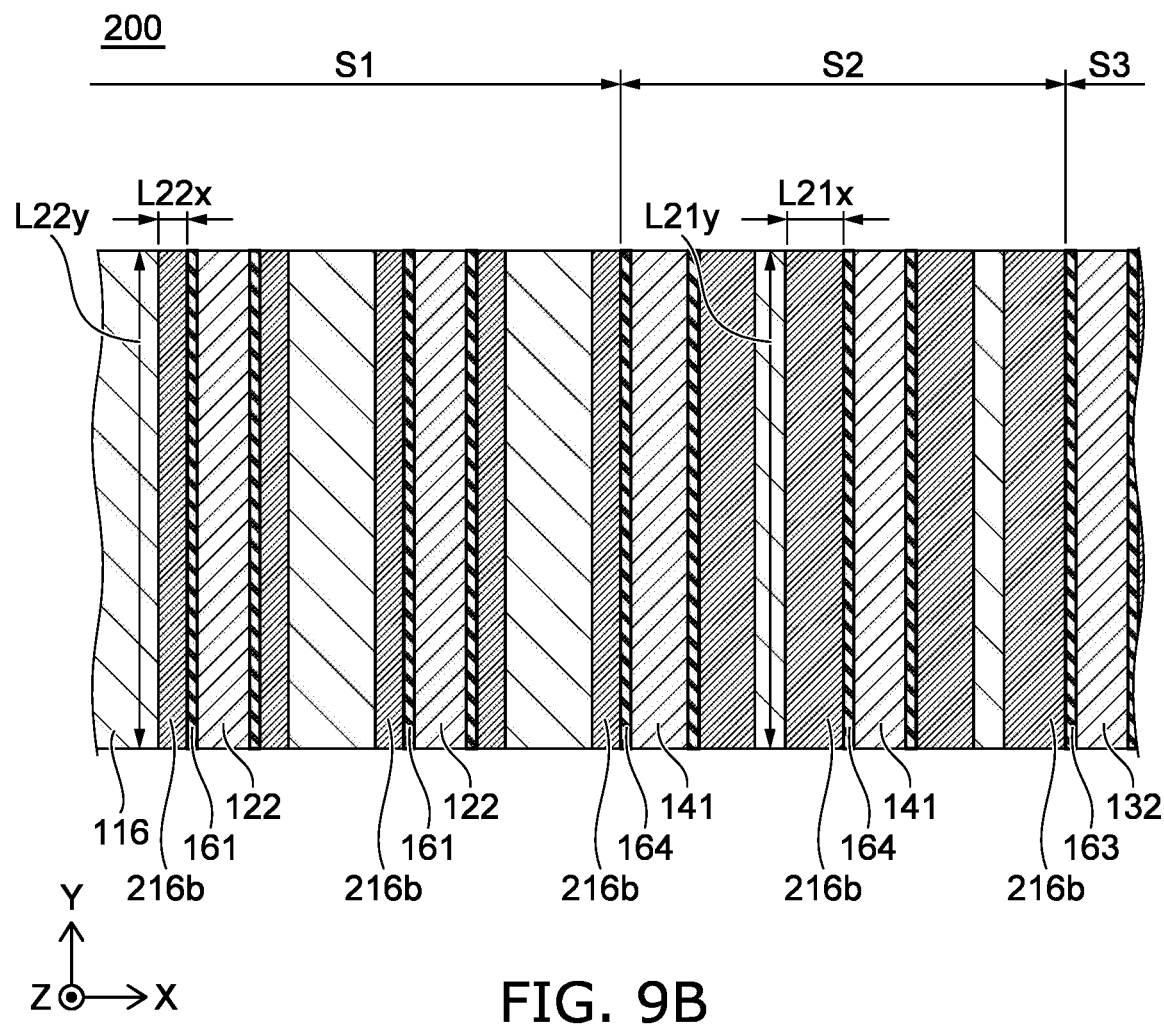
FIG. 9B is a top view showing the first modification of the semiconductor device according to the second embodiment.

FIG. 9B is a top view showing the first modification of the semiconductor device according to the second embodiment.

As a general rule in the following description, only the differences with the second embodiment are described. Other than the items described below, the first modification is similar to the second embodiment. This is similar for the other modifications and embodiments described below as well. The upper electrode 150 and the upper layer portions of the insulating films 161, 163, and 164 are not illustrated in FIG. 9B.

According to the first and second embodiments, the length L1 in the X-direction of each p⁺-type region 116b located in the boundary region S2 is substantially equal to the length L2 in the X-direction of each p⁺-type region 116b located in the diode region S1. However, as shown in FIG. 9A, a length L21x in the X-direction of each p⁺-type region 216b located in the boundary region S2 may be greater than a length L22x in the X-direction of each p⁺-type region 216b located in the diode region S1. According to the embodiment as shown in FIG. 9B, a length L21y in the Y-direction of each p⁺-type region 216b located in the boundary region S2 is substantially equal to a length L22y in the Y-direction of each p⁺-type region 216b located in the diode region S1. Accordingly, when viewed from above, that is, when viewed along the direction from the upper electrode 150 toward the lower electrode 110, the surface area of each p⁺-type region 216b located in the boundary region S2 is greater than the surface area of each p⁺-type region 216b located in the diode region S1.

By such a configuration, holes are easily injected from the p⁺-type region 216b into the n⁻-type base region 114b of the boundary region S2 when the diode region S1 and the boundary region S2 are in the on-state. Also, by such a configuration, holes are easily ejected from the n⁻-type base region 114b to the p⁺-type region 216b of the boundary region S2 when the diode region S1 and the boundary region S2 are in the recovery state. Damage of the boundary region S2 in recovery can be suppressed thereby.

However, the method of setting the surface area of each p⁺-type region located in the boundary region to be greater than the surface area of each p⁺-type region located in the diode region is not limited to that described above. For example, the length in the X-direction of each p⁺-type region located in the boundary region may be substantially equal to the length in the X-direction of each p⁺-type region located in the diode region; and the length in the Y-direction of each p⁺-type region located in the boundary region may be greater than the length in the Y-direction of each p⁺-type region located in the diode region. Also, the length in the X-direction of each p⁺-type region located in the boundary region may be greater than the length in the X-direction of each p⁺-type region located in the diode region; and the length in the Y-direction of each p⁺-type region located in the boundary region may be greater than the length in the Y-direction of each p⁺-type region located in the diode region.

Second Modification of Second Embodiment

A second modification of the second embodiment will now be described.

Figure 10:
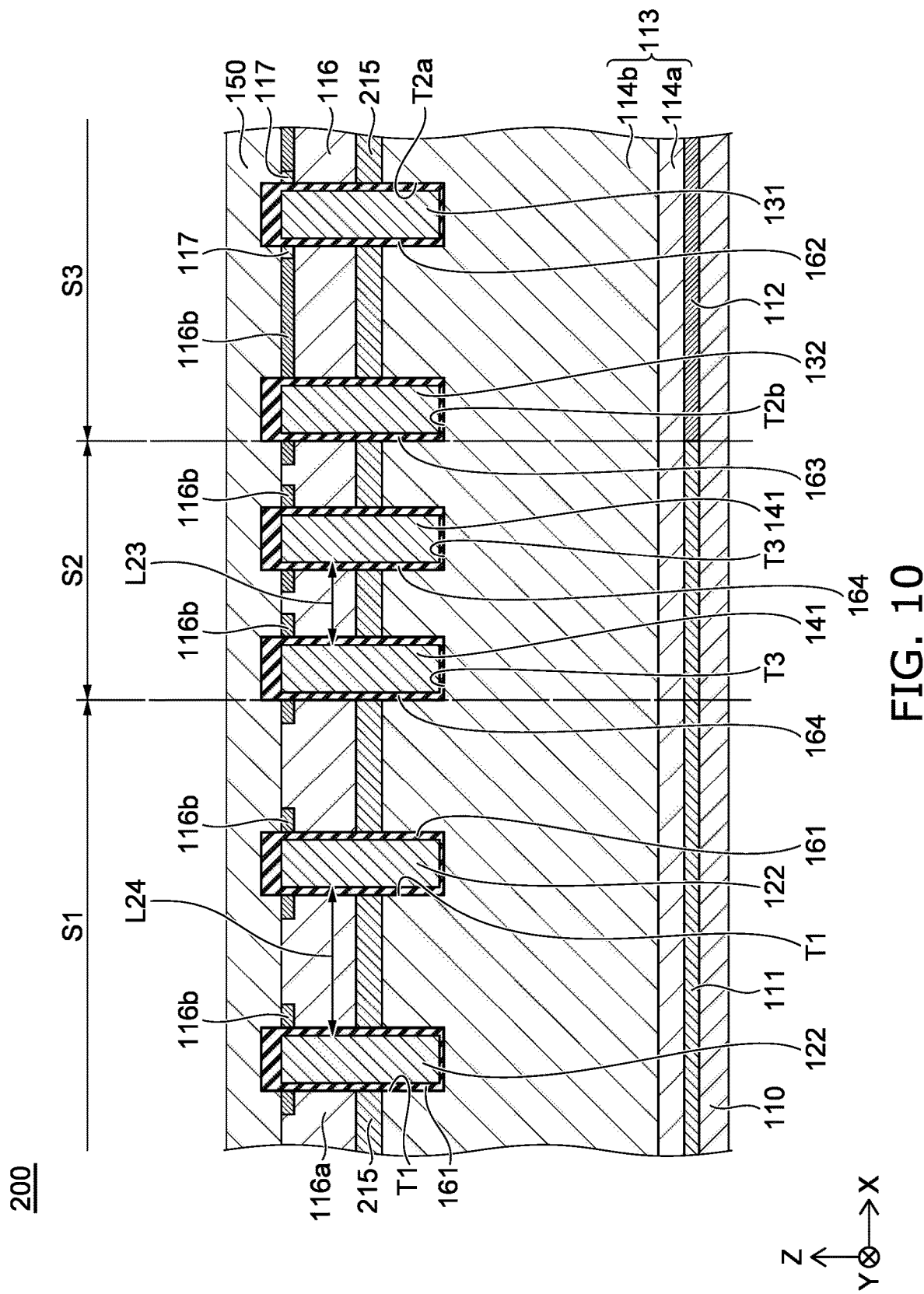
FIG. 10 is a cross-sectional view showing a second modification of the semiconductor device according to the second embodiment.

FIG. 10 is a cross-sectional view showing a second modification of the semiconductor device according to the second embodiment.

According to the first and second embodiments, the distance L3 in the X-direction between two adjacent gate electrodes 141 of the boundary region S2 is substantially equal to the distance L4 in the X-direction between two adjacent internal electrodes 122 of the diode region S1. However, as shown in FIG. 10, a distance L23 in the X-direction between the two adjacent gate electrodes 141 of the boundary region S2 may be less than a distance L24 in the X-direction between the two adjacent internal electrodes 122 of the diode region S1.

By such a configuration, the density of the p-type channel ch1 in the boundary region S2 can be increased. Therefore, holes are easily ejected from the n⁻-base layer 114 to the p-type layer 116 via the p-type channel ch1 when the diode region S1 and the boundary region S2 are in recovery. Damage of the boundary region S2 in recovery can be suppressed thereby.

Third Embodiment

Figure 11:
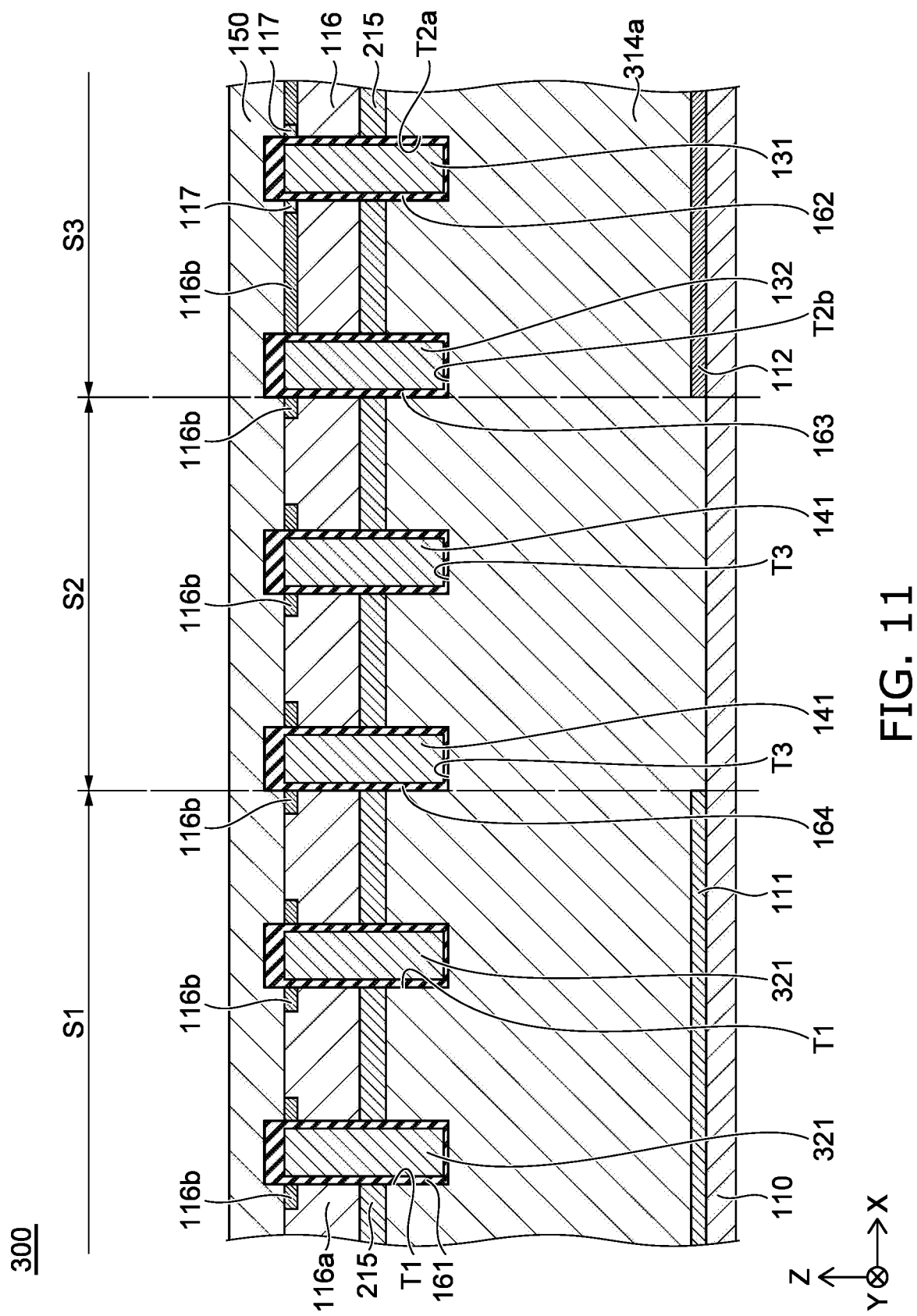
FIG. 11 is a cross-sectional view showing a semiconductor device according to a third embodiment.

A third embodiment will now be described.
FIG. 11 is a cross-sectional view showing a semiconductor device according to the embodiment.

In the semiconductor device 200 according to the second embodiment, the n-type barrier layer 215 is also located in the diode region S1; and the gate electrodes 141 of the boundary region S2 are electrically insulated from the internal electrodes 122 of the diode region S1. Conversely, in the semiconductor device 300 according to the embodiment, the n-type barrier layer 215 is also located in the diode region S1; however, a gate electrode 321 that is electrically connected to the gate electrode 141 of the boundary region S2 and electrically insulated from the gate electrode 131 and the upper electrode 150 is located in each trench T1 of the diode region S1. Thus, the gate electrode 321 may be located in the diode region S1.

Also, in the semiconductor device 300 according to the embodiment, an n⁻-type base layer 314a is located instead of the n-type layer 113. In the boundary region S2, the n⁺-type cathode layer 111 and the p⁺-type collector layer 112 are not provided; and the n⁻-type base layer 314a is located on the lower electrode 110 and contacts the lower electrode 110. In other words, the n⁻-type base layer 314a that has a lower impurity concentration than the n⁺-type cathode layer 111 is interposed between the n⁺-type cathode layer 111 and the p⁺-type collector layer 112. Accordingly, according to the embodiment, the boundary region S2 of the semiconductor device 300 corresponds to a region in which the n-type barrier layer 115 that is next to the gate electrode 141 is located and in which the n⁻-type base layer 314a contacts the lower electrode 110.

Thus, the gate electrode 321 that is electrically connected to the n-type barrier layer 215 and the gate electrodes 141 of the boundary region S2 may be located in the diode region S1. Also, the n⁻-type base layer 314a that has a lower impurity concentration than the n⁺-type cathode layer 111 may be interposed between the n⁺-type cathode layer 111 and the p⁺-type collector layer 112. By such a configuration, the carrier concentration in the boundary region S2 can be suppressed. The damage of the boundary region S2 in recovery can be suppressed thereby.

Fourth Embodiment

Figure 12:
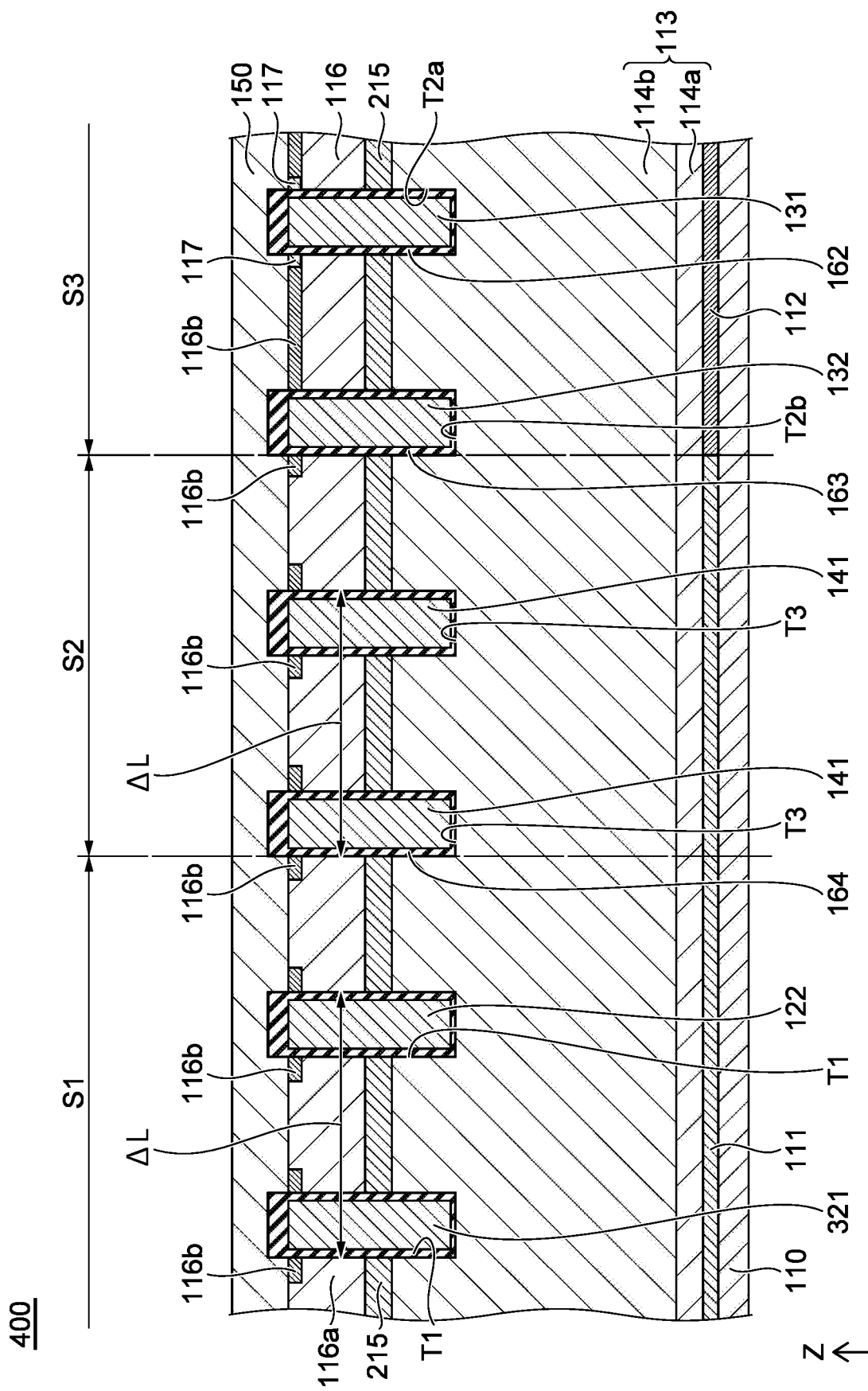
FIG. 12 is a cross-sectional view showing a semiconductor device according to a fourth embodiment.

A fourth embodiment will now be described.
FIG. 12 is a cross-sectional view showing a semiconductor device according to the embodiment.

In the semiconductor device 200 according to the second embodiment, the n-type barrier layer 215 is also located in the diode region S1; and the gate electrodes 141 of the boundary region S2 are electrically insulated from the internal electrodes 122 of the diode region S1. Conversely, in the semiconductor device 400 according to the embodiment, the n-type barrier layer 215 is also located in the diode region S1; however, the gate electrode 321 that is electrically connected to the gate electrode 141 of the boundary region S2 is located in several trenches T1 of the multiple trenches T1 of the diode region S1; and the internal electrode 122 that is electrically insulated from the gate electrode 141 of the boundary region S2 is located in the remaining trenches T1 of the multiple trenches T1 of the diode region S1.

Specifically, according to the embodiment, the gate electrode 321 and the internal electrode 122 are alternately located in the X-direction in the diode region S1. Conversely, in the boundary region S2, the gate electrode 141 is located in all of the trenches T3. Accordingly, the average number of the gate electrodes 141 per unit length ΔL in the X-direction in the boundary region S2 is greater than the average number of the gate electrodes 321 per unit length ΔL in the X-direction in the diode region S1. The average number of the gate electrodes per unit length ΔL in the X-direction in some region can be calculated by, for example, dividing the total number of gate electrodes in the region by the length in the X-direction of the region. Thus, according to the embodiment, the boundary region S2 of the semiconductor device 400 corresponds to the region in which the n-type barrier layer 115 next to the gate electrode is located where the average number of the gate electrodes per unit length ΔL is lower.

Thus, the n-type barrier layer 215 and the gate electrode 321 also may be located in the diode region S1; and the average number of the gate electrodes 141 per unit length ΔL in the X-direction in the boundary region S2 may be greater than the average number of the gate electrodes 321 per unit length ΔL in the X-direction in the diode region S1. In such a configuration as well, the trade-off relationship between the steady losses and recovery losses of the diode region S1 and the boundary region S2 can be improved. Also, in such a configuration as well, the damage of the boundary region S2 in recovery can be suppressed. In such a configuration as well, the amount of the carriers in the diode region S1 can be prevented from being less than the amount of the carriers of the boundary region S2.

According to the embodiment, an internal electrode that is electrically connected to the upper electrode 150 is not located in the boundary region S2. However, an internal electrode that is electrically connected to the upper electrode 150 may be located in the boundary region S2 as long as the average number of the gate electrodes 141 per unit length ΔL in the X-direction in the boundary region S2 can be greater than the average number of the gate electrodes 321 per unit length ΔL in the X-direction in the diode region S1.

Fifth Embodiment

A fifth embodiment will now be described.

Figure 13:
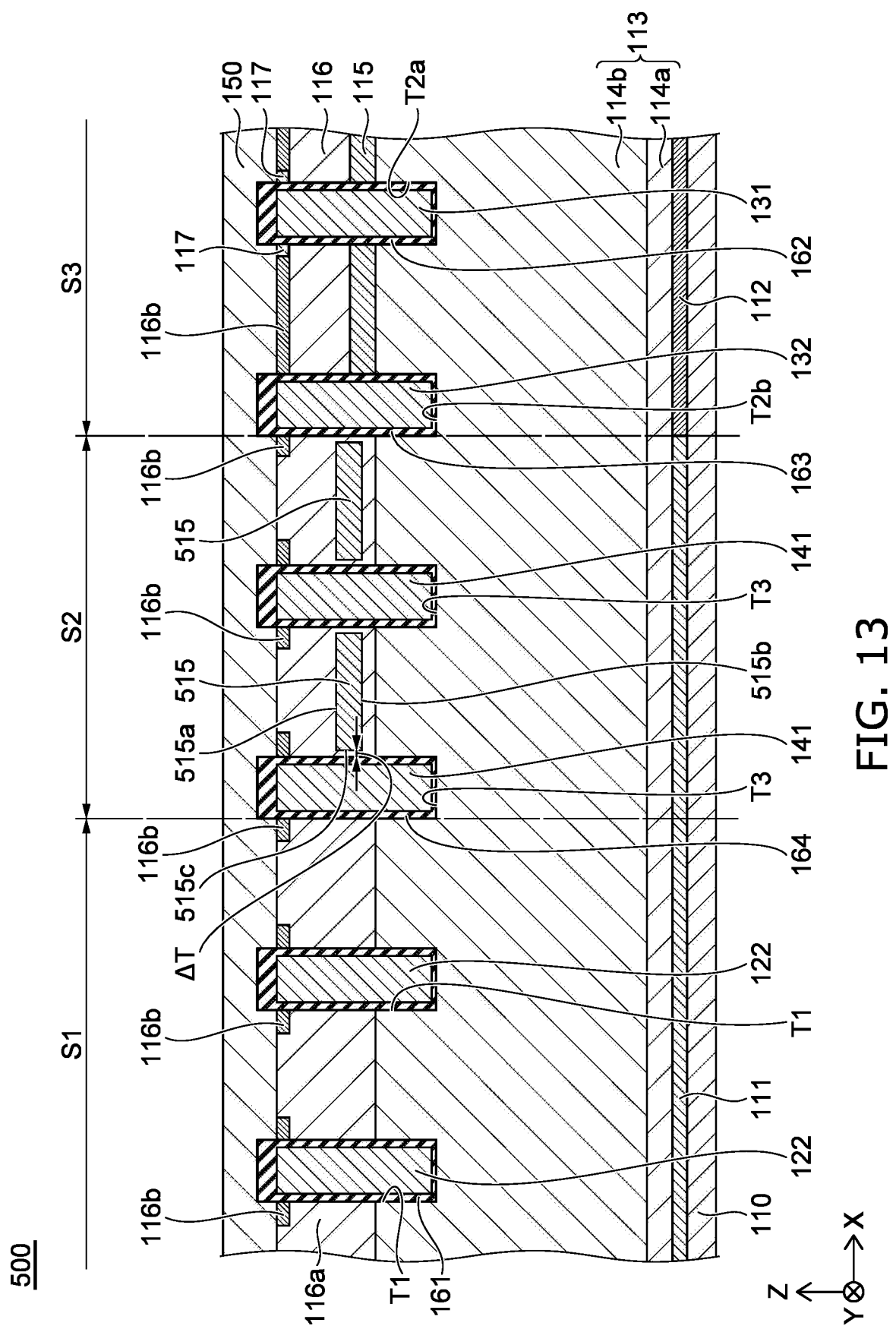
FIG. 13 is a cross-sectional view showing a semiconductor device according to a fifth embodiment.

FIG. 13 is a cross-sectional view showing a semiconductor device according to the embodiment.

According to the first to fourth embodiments, the n-type barrier layer 115 contacts the insulating film 164. Conversely, in the semiconductor device 500 according to the embodiment, an n-type barrier layer 515 does not contact the insulating film 164.

The n-type barrier layer 515 is located in the p-type layer 116, and more specifically, in the p-type region 116a. An upper surface 515a, a lower surface 515b, and two side surfaces 515c of the n-type barrier layer 515 are covered with the p-type region 116a. A length ΔT in the X-direction of the portion of the p-type layer 116 that is positioned between the n-type barrier layer 515 and the insulating film 164 is set to a length so that the n-type inversion layer that is formed in the p-type layer 116 when the positive voltage V22 is applied to the gate electrode 141 contacts the n-type barrier layer 515.

Thus, the n-type barrier layer 515 may be provided in the p-type layer 116; and the side surface 515c of the n-type barrier layer 515 may be covered with the p-type layer 116. In such a configuration as well, the trade-off relationship between the steady losses and recovery losses of the diode region S1 and the boundary region S2 can be improved. Also, in such a configuration as well, the damage of the boundary region S2 in recovery can be suppressed. In such a configuration, the voltage V21 may not be a negative voltage and may be 0 V. In other words, the signal sources SG2 and SG4 that apply the negative voltage to the gate electrode 141 are no longer necessary.

The multiple embodiments and modifications described above can be combined with each other. For example, the configuration that relates to the surface area of the p⁺-type region 216b of the first modification of the second embodiment is applicable to the semiconductor device 100 according to the first embodiment, the semiconductor device 300 according to the third embodiment, the semiconductor device 400 according to the fourth embodiment, and the semiconductor device 500 according to the fifth embodiment. For example, the configuration that relates to the distances L23 and L24 between the adjacent electrodes of the second modification of the second embodiment is applicable to the semiconductor device 100 according to the first embodiment, the semiconductor device 300 according to the third embodiment, the semiconductor device 400 according to the fourth embodiment, and the semiconductor device 500 according to the fifth embodiment. For example, the configuration of the first or second modification of the first embodiment is applicable to the semiconductor device 200 according to the second embodiment, the semiconductor device 400 according to the fourth embodiment, and the semiconductor device 500 according to the fifth embodiment. For example, the configuration of the fifth embodiment is applicable to the semiconductor device 200 according to the second embodiment, the semiconductor device 300 according to the third embodiment, and the semiconductor device 400 according to the fourth embodiment.

In each of the above embodiments, the example in which the semiconductor device is an n-channel type RC-IGBT has been described, but the semiconductor device may be a p-channel type RC-IGBT. In this case, the p-type of each layer in the above embodiment is replaced with the n-type, and the n-type of each layer in the above embodiment is replaced with the p-type. Further, in this case, the negative voltage in the above embodiment is replaced with positive voltage, and the positive voltage in the above embodiment is replaced with the negative voltage. That is, in the conduction state of the diode region, a positive voltage with respect to the internal electrode is applied to the gate electrode in the boundary region; before the recovery of the diode region, a negative voltage with respect to the internal electrode is applied to the gate electrode in the boundary region; and while the reverse recovery current is flowing in the diode region, a positive voltage with respect to the internal electrode is applied to the gate electrode in the boundary region.

Embodiments may include the following configurations (e.g., technological proposals).

Configuration 1

A semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;

a fourth semiconductor layer located on the third semiconductor layer in the boundary region and the IGBT region, the fourth semiconductor layer being of the first conductivity type and having a higher impurity concentration than an upper layer portion of the third semiconductor layer;

a fifth semiconductor layer located on the third semiconductor layer in the diode region and located on the fourth semiconductor layer in the boundary region and the IGBT region, the fifth semiconductor layer being of the second conductivity type;

a sixth semiconductor layer located at an upper layer portion of the fifth semiconductor layer in the IGBT region, the sixth semiconductor layer being of the first conductivity type;

a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;

a fifth electrode located on the fifth semiconductor layer;

a first insulating film located between the second electrode and the fifth semiconductor layer and between the second electrode and the third semiconductor layer;

a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer.

Configuration 2

A semiconductor device, a diode region, an IGBT region, and a boundary region being set in the device, the boundary region being positioned between the diode region and the IGBT region, the device comprising:

a first electrode located in the diode region, the boundary region, and the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;

a fourth semiconductor layer located on the third semiconductor layer in the diode region, the boundary region, and the IGBT region, the fourth semiconductor layer being of the first conductivity type and having a higher impurity concentration than an upper layer portion of the third semiconductor layer;

a fifth semiconductor layer located on the fourth semiconductor layer in the diode region, the boundary region, and the IGBT region, the fifth semiconductor layer being of the second conductivity type;

a sixth semiconductor layer located at an upper layer portion of the fifth semiconductor layer in the IGBT region, the sixth semiconductor layer being of the first conductivity type;

a second electrode extending from an upper surface of the fifth semiconductor layer toward the third semiconductor layer in the diode region, the second electrode being next to the fifth semiconductor layer, the fourth semiconductor layer, and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the second and third electrodes;

a fifth electrode located on the fifth semiconductor layer;

a first insulating film located between the second electrode and the fifth semiconductor layer, between the second electrode and the fourth semiconductor layer, and between the second electrode and the third semiconductor layer;

a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer.

Configuration 3
  A semiconductor device,
  a diode region, an IGBT region, and a boundary region being set in the device,
  the boundary region being positioned between the diode region and the IGBT region,
  the device comprising:
    a first electrode located in the diode region, the boundary region, and the IGBT region;
    a first semiconductor layer located on the first electrode in the diode region, the first semiconductor layer being of a first conductivity type;
    a second semiconductor layer located on the first electrode in the IGBT region, the second semiconductor layer being of a second conductivity type;
    a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
    a fourth semiconductor layer located on the third semiconductor layer in the IGBT region, the fourth semiconductor layer being of the first conductivity type and having a higher impurity concentration than an upper layer portion of the third semiconductor layer;
    a fifth semiconductor layer located on the third semiconductor layer in the diode region and the boundary region and located on the fourth semiconductor layer in the IGBT region, the fifth semiconductor layer being of the second conductivity type;
    a sixth semiconductor layer located at an upper layer portion of the fifth semiconductor layer in the IGBT region, the sixth semiconductor layer being of the first conductivity type;
    a seventh semiconductor layer located in the fifth semiconductor layer in the diode region, the seventh semiconductor layer being of the first conductivity type and including a side surface covered with the fifth semiconductor layer,
    a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;
    a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;
    a fourth electrode extending from the upper surface of the fifth semiconductor layer toward the third semiconductor layer in the boundary region, the fourth electrode being next to the fifth semiconductor layer and the third semiconductor layer in the first direction and being electrically insulated from the third electrode;
    a fifth electrode located on the fifth semiconductor layer;
    a first insulating film located between the second electrode and the fifth semiconductor layer and between the second electrode and the third semiconductor layer;
    a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and
    a third insulating film located between the fourth electrode and the fifth electrode, between the fourth electrode and the fifth semiconductor layer, and between the fourth electrode and the third semiconductor layer.

Configuration 4
  The device according to any one of Configurations 1 to 3, further comprising:
    an other second electrode extending from the upper surface of the fifth semiconductor layer toward the third semiconductor layer in the diode region, the other second electrode being next to the second electrode in the first direction with the fifth semiconductor layer interposed; and
    an other fourth electrode extending from the upper surface of the fifth semiconductor layer toward the third semiconductor layer in the boundary region, the other fourth electrode being next to the fourth electrode in the first direction with the fifth semiconductor layer interposed,
    a distance in the first direction between the fourth electrode and the other fourth electrode being less than a distance in the first direction between the second electrode and the other second electrode.

Configuration 5
  A semiconductor device,
  a diode region, an IGBT region, and a boundary region being set in the device,
  the boundary region being positioned between the diode region and the IGBT region,
  the device comprising:
    a first electrode located in the diode region, the boundary region, and the IGBT region;
    a first semiconductor layer located on the first electrode in the diode region, the first semiconductor layer being of a first conductivity type;
    a second semiconductor layer located on the first electrode in the IGBT region, the second semiconductor layer being of a second conductivity type;
    a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
    a fourth semiconductor layer located on the third semiconductor layer in the diode region, the boundary region, and the IGBT region, the fourth semiconductor layer being of the first conductivity type and having a higher impurity concentration than an upper layer portion of the third semiconductor layer;
    a fifth semiconductor layer located on the fourth semiconductor layer in the diode region, the boundary region, and the IGBT region, the fifth semiconductor layer being of the second conductivity type;

a sixth semiconductor layer located at an upper layer portion of the fifth semiconductor layer in the IGBT region, the sixth semiconductor layer being of the first conductivity type;

a second electrode extending from the upper surface of the fifth semiconductor layer toward the third semiconductor layer in the diode region, the second electrode being next to the fifth semiconductor layer, the fourth semiconductor layer, and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a plurality of fourth electrodes extending from the upper surface of the fifth semiconductor layer toward the third semiconductor layer in the diode region and the boundary region, the plurality of fourth electrodes being next to the fifth semiconductor layer, the fourth semiconductor layer, and the third semiconductor layer in the first direction and being insulated from the second and third electrodes, an average number of the plurality of fourth electrodes per unit length in the first direction in the boundary region being greater than an average number of the plurality of fourth electrodes per unit length in the first direction in the diode region;

a fifth electrode located on the fifth semiconductor layer;

a first insulating film located between the second electrode and the fifth semiconductor layer, between the second electrode and the fourth semiconductor layer, and between the second electrode and the third semiconductor layer;

a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a plurality of third insulating films located between the fifth electrode and each of the fourth electrodes, between the fifth semiconductor layer and each of the fourth electrodes, between the fourth semiconductor layer and each of the fourth electrodes, and between the third semiconductor layer and each of the fourth electrodes.

Configuration 6

The device according to any one of Configurations 1 to 5, wherein a portion of the third semiconductor layer is positioned between the first semiconductor layer and the second semiconductor layer in the first direction on the first electrode in the boundary region.

Configuration 7

The device according to any one of Configurations 1 to 5, wherein the first semiconductor layer and the second semiconductor layer are also located in the boundary region, and the first semiconductor layer and the second semiconductor layer are positioned between the first electrode and the third semiconductor layer in the boundary region.

Configuration 8

The device according to any one of Configurations 1 to 5, wherein the second semiconductor layer is also located in the boundary region, and the second semiconductor layer is positioned between the first electrode and the third semiconductor layer in the boundary region.

Configuration 9

The device according to any one of Configurations 1 to 5, wherein the first semiconductor layer is also located in the boundary region, and the first semiconductor layer is positioned between the first electrode and the third semiconductor layer in the boundary region.

Configuration 10

A semiconductor device, a diode region, an IGBT region, and a boundary region being set in the device, the boundary region being positioned between the diode region and the IGBT region, the device comprising:

a first electrode located in the diode region, the boundary region, and the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a third semiconductor layer positioned on the first semiconductor layer in the diode region, positioned on the first electrode in the boundary region, and positioned on the second semiconductor layer in the IGBT region, the third semiconductor layer being of the first conductivity type and having a lower impurity concentration than the first semiconductor layer;

a fourth semiconductor layer located on the third semiconductor layer in the diode region, the boundary region, and the IGBT region, the fourth semiconductor layer being of the first conductivity type and having a higher impurity concentration than an upper layer portion of the third semiconductor layer;

a fifth semiconductor layer located on the fourth semiconductor layer in the diode region, the boundary region, and the IGBT region, the fifth semiconductor layer being of the second conductivity type;

a sixth semiconductor layer located at an upper layer portion of the fifth semiconductor layer in the IGBT region, the sixth semiconductor layer being of the first conductivity type;

a second electrode extending from an upper surface of the fifth semiconductor layer toward the third semiconductor layer in the diode region, the second electrode being next to the fifth semiconductor layer, the fourth semiconductor layer, and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;

a fifth electrode located on the fifth semiconductor layer;

a first insulating film located between the second electrode and the fifth semiconductor layer, between the second electrode and the fourth semiconductor layer, and between the second electrode and the third semiconductor layer;

a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer.

Configuration 11

The device according to any one of Configurations 1 to 10, wherein the fifth semiconductor layer includes:
a first semiconductor region located in the diode region, the boundary region, and the IGBT region; and
a plurality of second semiconductor regions located at an upper layer portion of the first semiconductor region in the diode region, the boundary region, and the IGBT region, the plurality of second semiconductor regions being separated from each other in the first direction and having a higher impurity concentration than the first semiconductor region, a surface area of the second semiconductor region in the boundary region is greater than a surface area of the second semiconductor region in the diode region when viewed along a second direction, and the second direction is from the fifth electrode toward the first electrode.

Configuration 12

The device according to any one of Configurations 1 to 11, wherein a length in the first direction of the boundary region is less than a distance between a lower surface of the first semiconductor layer and an upper surface of the fifth semiconductor layer in the diode region.

Configuration 13

A driving method for the device according to any one of Configurations 1 to 9, 11 and 12, wherein the first conductive type is a n-type,
the second conductive type is a p-type,
in the conduction state of the diode region, a negative voltage with respect to the second electrode is applied to the fourth electrode in the boundary region,
before the recovery of the diode region, a positive voltage with respect to the second electrode is applied to the fourth electrode, and
while the reverse recovery current is flowing in the diode region, a negative voltage with respect to the second electrode is applied to the fourth electrode.

Configuration 14

A driving method for the device to any one of Configurations 1 to 9, 11 and 12, wherein the first conductive type is a p-type,
the second conductive type is a n-type,
in the conduction state of the diode region, a positive voltage with respect to the second electrode is applied to the fourth electrode in the boundary region,
before the recovery of the diode region, a negative voltage with respect to the second electrode is applied to the fourth electrode, and
while the reverse recovery current is flowing in the diode region, a positive voltage with respect to the second electrode is applied to the fourth electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
a fourth semiconductor layer located on the third semiconductor layer in the boundary region and the IGBT region, the fourth semiconductor layer being of the first conductivity type and having a higher impurity concentration than an upper layer portion of the third semiconductor layer;
a fifth semiconductor layer located on the third semiconductor layer in the diode region and located on the fourth semiconductor layer in the boundary region and the IGBT region, the fifth semiconductor layer being of the second conductivity type;
a sixth semiconductor layer located at an upper layer portion of the fifth semiconductor layer in the IGBT region, the sixth semiconductor layer being of the first conductivity type;
a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;

a fifth electrode located on the fifth semiconductor layer;

a first insulating film located between the second electrode and the fifth semiconductor layer and between the second electrode and the third semiconductor layer;

a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer;

a third insulating film located between the fourth electrode and the fifth electrode, between the fourth electrode and the fifth semiconductor layer, between the fourth electrode and the fourth semiconductor layer, and between the fourth electrode and the third semiconductor layer;

an other second electrode extending from the upper surface of the fifth semiconductor layer toward the third semiconductor layer in the diode region, the other second electrode being next to the second electrode in the first direction with the fifth semiconductor layer interposed; and an other fourth electrode extending from the upper surface of the fifth semiconductor layer toward the third semiconductor layer in the boundary region, the other fourth electrode being next to the fourth electrode in the first direction with the fifth semiconductor layer interposed, a distance in the first direction between the fourth electrode and the other fourth electrode being less than a distance in the first direction between the second electrode and the other second electrode.

2. The device according to claim 1, wherein a portion of the third semiconductor layer is positioned between the first semiconductor layer and the second semiconductor layer in the first direction on the first electrode in the boundary region.

3. The device according to claim 1, wherein
the first semiconductor layer and the second semiconductor layer are also located in the boundary region, and
the first semiconductor layer and the second semiconductor layer are positioned between the first electrode and the third semiconductor layer in the boundary region.

4. The device according to claim 1, wherein
the second semiconductor layer is also located in the boundary region, and
the second semiconductor layer is positioned between the first electrode and the third semiconductor layer in the boundary region.

5. The device according to claim 1, wherein
the first semiconductor layer is also located in the boundary region, and
the first semiconductor layer is positioned between the first electrode and the third semiconductor layer in the boundary region.

6. A semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
a fourth semiconductor layer located on the third semiconductor layer in the diode region, the boundary region, and the IGBT region, the fourth semiconductor layer being of the first conductivity type and having a higher impurity concentration than an upper layer portion of the third semiconductor layer;
a fifth semiconductor layer located on the fourth semiconductor layer in the diode region, the boundary region, and the IGBT region, the fifth semiconductor layer being of the second conductivity type;
a sixth semiconductor layer located at an upper layer portion of the fifth semiconductor layer in the IGBT region, the sixth semiconductor layer being of the first conductivity type;
a second electrode extending from an upper surface of the fifth semiconductor layer toward the third semiconductor layer in the diode region, the second electrode being next to the fifth semiconductor layer, the fourth semiconductor layer, and the third semiconductor layer in a first direction, the first direction being from the diode region toward the IGBT region;
a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;
a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the second and third electrodes;

a fifth electrode located on the fifth semiconductor layer;
a first insulating film located between the second electrode and the fifth semiconductor layer, between the second electrode and the fourth semiconductor layer, and between the second electrode and the third semiconductor layer;
a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer;
a third insulating film located between the fourth electrode and the fifth electrode, between the fourth electrode and the fifth semiconductor layer, between the fourth electrode and the fourth semiconductor layer, and between the fourth electrode and the third semiconductor layer;
an other second electrode extending from the upper surface of the fifth semiconductor layer toward the third semiconductor layer in the diode region, the other second electrode being next to the second electrode in the first direction with the fifth semiconductor layer interposed; and
an other fourth electrode extending from the upper surface of the fifth semiconductor layer toward the third semiconductor layer in the boundary region, the other fourth electrode being next to the fourth electrode in the first direction with the fifth semiconductor layer interposed,
a distance in the first direction between the fourth electrode and the other fourth electrode being less than a distance in the first direction between the second electrode and the other second electrode.

7. A semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
a fourth semiconductor layer located on the third semiconductor layer in the IGBT region, the fourth semiconductor layer being of the first conductivity type and having a higher impurity concentration than an upper layer portion of the third semiconductor layer;
a fifth semiconductor layer located on the third semiconductor layer in the diode region and the boundary region and located on the fourth semiconductor layer in the IGBT region, the fifth semiconductor layer being of the second conductivity type;
a sixth semiconductor layer located at an upper layer portion of the fifth semiconductor layer in the IGBT region, the sixth semiconductor layer being of the first conductivity type;
a seventh semiconductor layer located in the fifth semiconductor layer in the diode region, the seventh semiconductor layer being of the first conductivity type and including a side surface covered with the fifth semiconductor layer;
a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;
a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;
a fourth electrode extending from the upper surface of the fifth semiconductor layer toward the third semiconductor layer in the boundary region, the fourth electrode being next to the fifth semiconductor layer and the third semiconductor layer in the first direction and being electrically insulated from the third electrode;
a fifth electrode located on the fifth semiconductor layer;
a first insulating film located between the second electrode and the fifth semiconductor layer and between the second electrode and the third semiconductor layer;
a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and
a third insulating film located between the fourth electrode and the fifth electrode, between the fourth electrode and the fifth semiconductor layer, and between the fourth electrode and the third semiconductor layer.

8. A semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;

a fourth semiconductor layer located on the third semiconductor layer in the boundary region and the IGBT region, the fourth semiconductor layer being of the first conductivity type and having a higher impurity concentration than an upper layer portion of the third semiconductor layer;

a fifth semiconductor layer located on the third semiconductor layer in the diode region and located on the fourth semiconductor layer in the boundary region and the IGBT region, the fifth semiconductor layer being of the second conductivity type;

a sixth semiconductor layer located at an upper layer portion of the fifth semiconductor layer in the IGBT region, the sixth semiconductor layer being of the first conductivity type;

a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;

a fifth electrode located on the fifth semiconductor layer;

a first insulating film located between the second electrode and the fifth semiconductor layer and between the second electrode and the third semiconductor layer;

a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer; and a third insulating film located between the fourth electrode and the fifth electrode, between the fourth electrode and the fifth semiconductor layer, between the fourth electrode and the fourth semiconductor layer, and between the fourth electrode and the third semiconductor layer, wherein the fifth semiconductor layer includes:
a first semiconductor region located in the diode region, the boundary region, and the IGBT region; and
a plurality of second semiconductor regions located at an upper layer portion of the first semiconductor region in the diode region, the boundary region, and the IGBT region, the plurality of second semiconductor regions being separated from each other in the first direction and having a higher impurity concentration than the first semiconductor region, a surface area of the second semiconductor region in the boundary region is greater than a surface area of the second semiconductor region in the diode region when viewed along a second direction, and the second direction is from the fifth electrode toward the first electrode.

9. A semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
a fourth semiconductor layer located on the third semiconductor layer in the boundary region and the IGBT region, the fourth semiconductor layer being of the first conductivity type and having a higher impurity concentration than an upper layer portion of the third semiconductor layer;
a fifth semiconductor layer located on the third semiconductor layer in the diode region and located on the fourth semiconductor layer in the boundary region and the IGBT region, the fifth semiconductor layer being of the second conductivity type;
a sixth semiconductor layer located at an upper layer portion of the fifth semiconductor layer in the IGBT region, the sixth semiconductor layer being of the first conductivity type;
a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;
a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;
a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;

a fifth electrode located on the fifth semiconductor layer;
a first insulating film located between the second electrode and the fifth semiconductor layer and between the second electrode and the third semiconductor layer; and
a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer, wherein
a length in the first direction of the boundary region is less than a distance between a lower surface of the first semiconductor layer and an upper surface of the fifth semiconductor layer in the diode region.

10. A driving method for a semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
a fourth semiconductor layer located on the third semiconductor layer in the boundary region and the IGBT region, the fourth semiconductor layer being of the first conductivity type and having a higher impurity concentration than an upper layer portion of the third semiconductor layer;
a fifth semiconductor layer located on the third semiconductor layer in the diode region and located on the fourth semiconductor layer in the boundary region and the IGBT region, the fifth semiconductor layer being of the second conductivity type;
a sixth semiconductor layer located at an upper layer portion of the fifth semiconductor layer in the IGBT region, the sixth semiconductor layer being of the first conductivity type;
a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;
a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;
a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;
a fifth electrode located on the fifth semiconductor layer;
a first insulating film located between the second electrode and the fifth semiconductor layer and between the second electrode and the third semiconductor layer; and
a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer, wherein
the first conductive type is a n-type,
the second conductive type is a p-type,
in the conduction state of the diode region, a negative voltage with respect to the second electrode is applied to the fourth electrode in the boundary region,
before the recovery of the diode region, a positive voltage with respect to the second electrode is applied to the fourth electrode, and
while the reverse recovery current is flowing in the diode region, a negative voltage with respect to the second electrode is applied to the fourth electrode.

11. A driving method for a semiconductor device,
a diode region, an IGBT region, and a boundary region being set in the device,
the boundary region being positioned between the diode region and the IGBT region,
the device comprising:
a first electrode located in the diode region, the boundary region, and the IGBT region;
a first semiconductor layer located on the first electrode in the diode region, the first semiconductor layer being of a first conductivity type;
a second semiconductor layer located on the first electrode in the IGBT region, the second semiconductor layer being of a second conductivity type;
a third semiconductor layer located in the diode region, the boundary region, and the IGBT region, the third semiconductor layer being positioned on the first semiconductor layer in the diode region and positioned on the second semiconductor layer in the IGBT region, the third semiconductor layer being of the first conductivity type and having a lower impurity concentration than the first semiconductor layer;
a fourth semiconductor layer located on the third semiconductor layer in the boundary region and the IGBT region, the fourth semiconductor layer being of the first conductivity type and having a higher impurity concentration than an upper layer portion of the third semiconductor layer;
a fifth semiconductor layer located on the third semiconductor layer in the diode region and located on the fourth semiconductor layer in the boundary region and the IGBT region, the fifth semiconductor layer being of the second conductivity type;

a sixth semiconductor layer located at an upper layer portion of the fifth semiconductor layer in the IGBT region, the sixth semiconductor layer being of the first conductivity type;

a second electrode extending from an upper surface of the fifth semiconductor layer toward the third semiconductor layer in the diode region, the second electrode being next to the fifth semiconductor layer and the third semiconductor layer in a first direction, the first direction being from the diode region toward the IGBT region;

a third electrode extending from an upper surface of the sixth semiconductor layer toward the third semiconductor layer in the IGBT region, the third electrode being next to the sixth semiconductor layer, the fifth semiconductor layer, the fourth semiconductor layer, and the third semiconductor layer in the first direction;

a fourth electrode extending from the upper surface of the fifth semiconductor layer toward the third semiconductor layer in the boundary region, the fourth electrode being next to the fifth semiconductor layer, the fourth semiconductor layer, and the third semiconductor layer in the first direction and being electrically insulated from the third electrode;

a fifth electrode located on the fifth semiconductor layer;

a first insulating film located between the second electrode and the fifth semiconductor layer and between the second electrode and the third semiconductor layer; and a second insulating film located between the third electrode and the fifth electrode, between the third electrode and the sixth semiconductor layer, between the third electrode and the fifth semiconductor layer, between the third electrode and the fourth semiconductor layer, and between the third electrode and the third semiconductor layer, wherein the first conductive type is a p-type, the second conductive type is a n-type, in the conduction state of the diode region, a positive voltage with respect to the second electrode is applied to the fourth electrode in the boundary region, before the recovery of the diode region, a negative voltage with respect to the second electrode is applied to the fourth electrode, and while the reverse recovery current is flowing in the diode region, a positive voltage with respect to the second electrode is applied to the fourth electrode.

\* \* \* \* \*